United States Patent
Riho

(10) Patent No.: US 8,483,986 B2
(45) Date of Patent: Jul. 9, 2013

(54) SEMICONDUCTOR DEVICE, SYSTEM WITH SEMICONDUCTOR DEVICE, AND CALIBRATION METHOD

(75) Inventor: Yoshiro Riho, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 342 days.

(21) Appl. No.: 12/926,047

(22) Filed: Oct. 22, 2010

(65) Prior Publication Data

US 2011/0102073 A1 May 5, 2011

(30) Foreign Application Priority Data

Nov. 5, 2009 (JP) ................................ 2009-253694

(51) Int. Cl.
*G05F 1/10* (2006.01)

(52) U.S. Cl.
USPC ............... 702/99; 702/65; 702/133; 327/108; 327/112; 327/538; 327/541; 326/30; 326/32

(58) Field of Classification Search
USPC .............. 702/65, 99, 133; 327/108, 112, 170, 327/541, 262, 517, 538; 326/30, 32, 34, 82, 326/87; 257/390
See application file for complete search history.

(56) References Cited

U.S. PATENT DOCUMENTS

| | | | |
|---|---|---|---|
| 6,049,221 A * | 4/2000 | Ishibashi et al. | 326/30 |
| 6,307,791 B1 * | 10/2001 | Otsuka et al. | 365/189.05 |
| 6,469,539 B2 * | 10/2002 | Kim | 326/30 |
| 6,525,558 B2 * | 2/2003 | Kim et al. | 326/30 |
| 6,661,250 B2 * | 12/2003 | Kim et al. | 326/30 |
| 6,928,379 B2 * | 8/2005 | Fulton et al. | 702/130 |
| 7,068,065 B1 * | 6/2006 | Nasrullah | 326/30 |
| 7,135,884 B1 * | 11/2006 | Talbot et al. | 326/30 |
| 7,176,729 B2 * | 2/2007 | Hayashi et al. | 327/108 |
| 7,262,643 B2 * | 8/2007 | Hayashi et al. | 327/108 |
| 7,323,901 B2 * | 1/2008 | Aoyama et al. | 326/30 |
| 7,443,212 B2 * | 10/2008 | Hayashi et al. | 327/108 |
| 7,514,954 B2 * | 4/2009 | Kim et al. | 326/30 |
| 7,595,645 B2 | 9/2009 | Fujisawa et al. | |
| 7,633,310 B2 * | 12/2009 | Fukushi | 326/30 |
| 8,197,123 B2 * | 6/2012 | Snyder et al. | 374/1 |
| 2004/0251940 A1 * | 12/2004 | Hayashi et al. | 327/108 |
| 2006/0255842 A1 * | 11/2006 | Hayashi et al. | 327/108 |
| 2006/0261844 A1 * | 11/2006 | Kim et al. | 326/30 |
| 2006/0279340 A1 * | 12/2006 | Toyoshima | 327/112 |
| 2007/0188187 A1 * | 8/2007 | Oliva et al. | 326/30 |
| 2007/0263459 A1 * | 11/2007 | Kim et al. | 365/189.11 |

(Continued)

FOREIGN PATENT DOCUMENTS

| | | |
|---|---|---|
| JP | 2007-110615 A | 4/2007 |
| JP | 2008-135925 A | 6/2008 |

*Primary Examiner* — Carol Tsai
(74) *Attorney, Agent, or Firm* — McGinn IP Law Group, PLLC

(57) ABSTRACT

Variations of the impedance of each output driver of a semiconductor device can be reduced, and high-speed calibration is achieved. A calibration circuit including a replica circuit having the same configuration as each pull-up circuit or pull-down circuit included in an output driver of a semiconductor device is provided within a chip. During a first calibration operation, the replica circuit is provided with voltage conditions that allow the maximum current to flow through the output driver so that an impedance of the replica circuit is equal to a value of an external resistor. During a second calibration operation, table parameters obtained in the first calibration operation are used to adjust the impedance of the output driver without use of the replica circuit.

18 Claims, 14 Drawing Sheets

U.S. PATENT DOCUMENTS

| | | | |
|---|---|---|---|
| 2007/0296470 A1* | 12/2007 | Hayashi et al. | 327/108 |
| 2008/0054935 A1* | 3/2008 | Pan | 326/30 |
| 2008/0106301 A1* | 5/2008 | Fukushi | 326/82 |
| 2008/0122450 A1 | 5/2008 | Yokou | |
| 2008/0211548 A1* | 9/2008 | Hayashi et al. | 327/108 |
| 2009/0267642 A1* | 10/2009 | Pan | 326/30 |

* cited by examiner

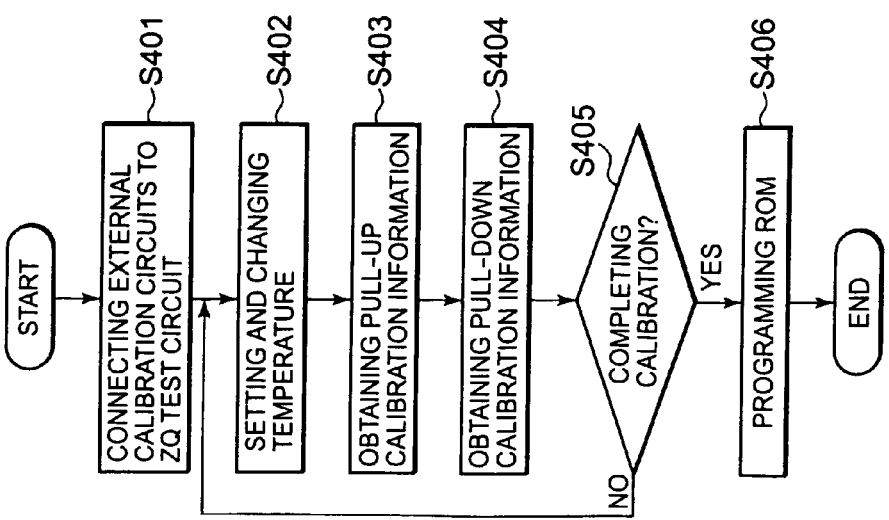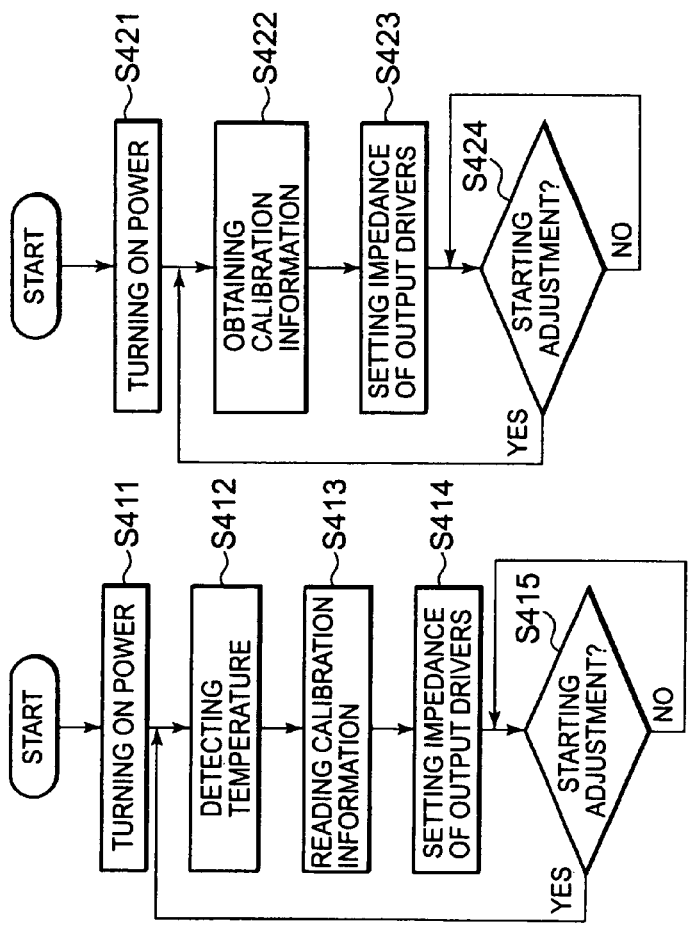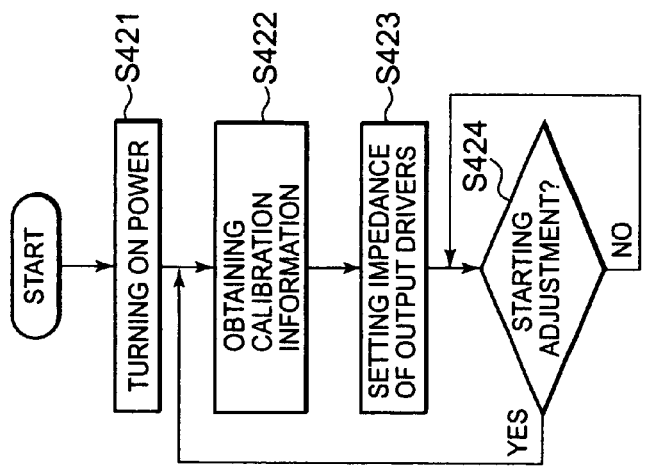

| A5 | A1 | IMPEDANCE CONTROL OF OUTPUT DRIVER |
|----|----|-----|
| 0 | 0 | RZQ / 6 = 40 Ω |
| 0 | 1 | RZQ / 7 = 34 Ω |
| 1 | 0 | RZQ / TBD |
| 1 | 1 | RZQ / TBD |

RZQ=240Ω, TBD: TO BE DETERMINED

|Vput|=0.5×VDDQ:0.7×34Ω<RONpu<0.9×34Ω
|Vput|=1.0×VDDQ:0.9×34Ω<RONpu<1.1×34Ω

|Vput|=0.2×VDDQ:0.6×34Ω<RONpu<1.1×34Ω
|Vput|=0.5×VDDQ:0.9×34Ω<RONpu<1.1×34Ω
|Vput|=0.8×VDDQ:0.9×34Ω<RONpu<1.4×34Ω

|Vout|=0.5×VDDQ:0.7×34Ω＜RONpd＜0.9×34Ω
|Vout|=1.0×VDDQ:0.9×34Ω＜RONpd＜1.1×34Ω

|Vout|=0.2×VDDQ:0.6×34Ω＜RONpd＜1.1×34Ω
|Vout|=0.5×VDDQ:0.9×34Ω＜RONpd＜1.1×34Ω
|Vout|=0.8×VDDQ:0.9×34Ω＜RONpd＜1.4×34Ω

FIG. 12A
| MODEL_Ver:V1-1 | | | |
|---|---|---|---|
| | MODEL | VDDQ[V] | Ti[°C] |
| Lpaw | SLOW | 1.25 | 110 |
| AW | SLOW | 1.40 | 110 |
| TYP | TYP | 1.50 | 65 |
| MW | FAST | 1.60 | -5 |
FIG. 12B
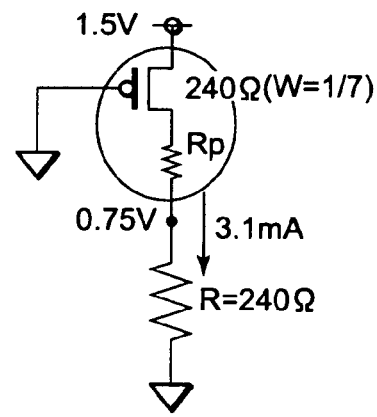
FIG. 12C
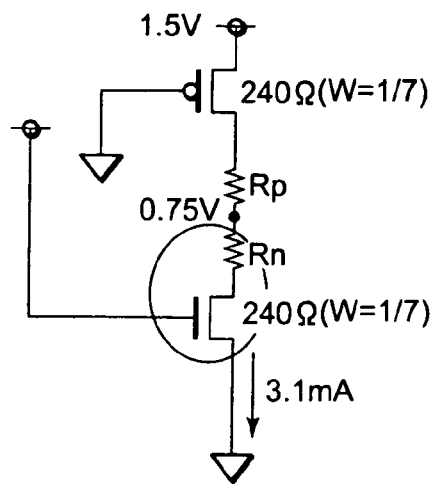

SEMICONDUCTOR DEVICE, SYSTEM WITH SEMICONDUCTOR DEVICE, AND CALIBRATION METHOD

This application is based upon and claims the benefit of priority from Japanese patent application No. 2009-253694, filed on Nov. 5, 2009, the disclosure of which is incorporated herein in its entirety by reference.

BACKGROUND OF THE INVENTION

1. Field of the Invention

The present invention relates to a semiconductor device, a system including a semiconductor device, and calibration thereof. More particularly, the present invention relates to a calibration method and a calibration circuit for controlling an impedance of an output driver connected to an external terminal.

2. Description of Related Art

A semiconductor device according to a related art includes a calibration circuit therein so as to control an impedance of each output driver formed by transistors. The calibration circuit includes a replica circuit which is identical in structure to the output driver of the semiconductor device. The replica circuit is connected to an external terminal, to which an external resistance element is connected at the time of calibration. The external resistance element is located or arranged outside of the semiconductor device and, for example, is placed on a motherboard in a system on which the semiconductor device has been mounted. If the system is formed by a module on which a plurality of semiconductor devices are mounted, the external resistance element is provided on the module substrate.

The calibration is performed by connecting the external resistance element of a predetermined resistance value (e.g., 240 Ω±1%) between the external terminal and the ground. When a power source voltage (e.g., 1.5 V) is applied to the replica circuit, a divided voltage appears on the external terminal as a result of dividing the power source voltage by the replica circuit and the external resistance element. While the divided voltage appearing on the external terminal is compared with a reference voltage (equal to a half of the power source voltage), the impedance value of the replica circuit is controlled such that the divided voltage of the external terminal is equal to the reference voltage. Thus, the controlled impedance value of the replica circuit is equal to the resistance value of the external resistance element. An impedance value of the output driver is controlled by the use of control information (calibration information) for controlling the impedance value of the replica circuit. See, e.g., JP-A 2007-110615 (Patent Document 1) and JP-A 2008-135925 (Patent Document 2). In the following description, the external resistance element may simply be referred to as an external resistor, and the impedance value may simply be referred to as the impedance.

In a semiconductor device according to the related art (which may simply called a related semiconductor device hereinafter), the calibration method is performed by using a half voltage (½: e.g., 0.75 V) of the power source voltage VDD as the reference voltage. However, a voltage equal to the power source voltage VDD is supplied to the output driver when the output driver is actually operated (for example, at the time of read-out when stored information is outputted from the semiconductor device after calibration). Specifically, voltage relationships supplied to gate terminals, source terminals, and drain terminals of the transistors of the output driver may be often changed to each other at the time of the calibration and at the time of the read-out. Therefore, an impedance at the time of the read-out of the output driver may differ from an impedance calculated by the calibration. Furthermore, a difference between the impedance calculated by the calibration and the impedance at the time of actual operation may vary (or have variations) depending upon the output driver. Moreover, according to the calibration method of a related semiconductor device, the system consumes much electric power when the calibration is performed. Furthermore, according to the calibration method of a related semiconductor device, the calibration requires a long period of time until it is finished. Moreover, in some cases, the calibration method of a related semiconductor device cannot complete impedance matching within the period of the calibration due to external/internal factors such as noise caused at the time of the calibration. Furthermore, in view of improvement of the integration and reduction of the number of parts, it is desirable to eliminate an external resistance element from a highly integrated substrate.

SUMMARY

A calibration method according to a first aspect of the present invention is used as a calibration method of an impedance value of an output driver included in a semiconductor device and connected to a first external terminal of the semiconductor device. A calibration circuit including a replica circuit connected to a second external terminal of the semiconductor device is used. The replica circuit has the same configuration as the output driver. The replica circuit is provided with a voltage condition that allows the output driver to produce a maximum current. An impedance value of the replica circuit is controlled so that the impedance of the replica circuit becomes equal to a value of an external resistance having a first end connected to the second external terminal to thereby match the impedance value of the output driver with the impedance value of the replica circuit. The external resistance is provided outside of the semiconductor device.

A semiconductor device according to a second aspect of the present invention includes a first external terminal, a second external terminal, and a replica circuit having the same configuration as a pull-up circuit for outputting, to the first external terminal, a first voltage corresponding to high-level data outputted from an output transistor included in an output driver connected to the first external terminal, or a pull-down circuit for outputting, to the first external terminal, a second voltage corresponding to low-level data outputted from the output transistor. The replica circuit is connected between the second external terminal and a first power source corresponding to one of the first voltage and the second voltage. The semiconductor device also includes a comparator operable to compare a voltage of the second external terminal with the other voltage of the first voltage and the second voltage and a control circuit operable to control an impedance value of the replica circuit depending upon an output of the comparator so as to match an impedance value of the output driver with the impedance value of the replica circuit.

A system according to a third aspect of the present invention includes a first semiconductor device and a second semiconductor. Each of the first semiconductor device and the second semiconductor device includes a first external terminal, a second external terminal, and a replica circuit having the same configuration as a pull-up circuit for outputting, to the first external terminal, a first voltage corresponding to high-level data outputted from an output transistor included in an output driver connected to the first external terminal, or a pull-down circuit for outputting, to the first external terminal, a second voltage corresponding to low-level data outputted from the output transistor. The replica circuit is connected between the second external terminal and a first power source corresponding to one of the first voltage and the second voltage. Each of the first semiconductor device and the second semiconductor device also includes a comparator operable to compare a voltage of the second external terminal with a voltage of a second power source corresponding to the other voltage of the first voltage and the second voltage and a control circuit operable to control an impedance value of the replica circuit depending upon an output of the comparator so as to match an impedance value of the output driver with the impedance value of the replica circuit. The second semiconductor device further includes an adjustment circuit having a memory unit for storing table parameters for adjusting the impedance value of the output driver of each of the first semiconductor device and the second semiconductor device. The adjustment circuit of the second semiconductor device outputs an output signal to the control circuit of the first semiconductor device. The control circuit of the first semiconductor device controls the impedance value of the output driver of the first semiconductor device with information outputted from the adjustment circuit of the second semiconductor device without use of the replica circuit of the first semiconductor device.

A control method of a semiconductor device according to a fourth aspect of the present invention includes a first calibration operation including obtaining calibration information corresponding to at least two different temperatures with use of a calibration circuit and storing the calibration information as table parameters in a memory unit. The control method also includes a second calibration operation including reading the table parameter corresponding to a detected temperature from the memory unit and setting an impedance value of an output driver based on the read table parameter.

According to the present invention, a calibration operation is performed under a voltage condition that allows the maximum current to flow through the output driver. Therefore, the adjusted impedance precisely coincides with the impedance at the time when the output driver actually operates. Therefore, variations of the impedance can be reduced between a plurality of output drivers. Furthermore, with the parameter table obtained by a calibration test conducted at the time of vendor's shipment, a calibration operation can be performed with reference to only the table in a system on which the semiconductor device has been mounted. Accordingly, it is possible to shorten a period of time required for a calibration operation and to decrease the electric power consumption in the system. Since this results in a reduction of noise, it is possible to avoid a situation in which impedance matching cannot be completed. Moreover, the degree of integration of a substrate can be improved while the number of parts can be reduced. According to the present invention, at least one of those advantages can be obtained.

BRIEF DESCRIPTION OF THE DRAWINGS

The above features and advantages of the present invention will be more apparent from the following description of certain preferred embodiments taken in conjunction with the accompanying drawings, in which:

FIGS. 4A and 4B are flow charts explanatory of calibration operations in the semiconductor device of FIG. 1.

FIG. 4C is a flow chart explanatory of a calibration operation in a related semiconductor device.

FIG. 12A is a table showing part of conditions to obtain the graphs of FIGS. 11A and 11B.

FIGS. 12B and 12C are circuit diagrams of a pull-up output driver and a pull-down output driver formed at the time of measurement of the characteristics of the output driver.

DETAILED DESCRIPTION OF THE PREFERRED EMBODIMENTS

Some typical examples of the technical concept to solve the problems of the present invention will be illustrated below. The scope of protection for which the present application seeks is not limited to those illustrated examples and embodiments and is defined by the appended claims.

A first example relates to a calibration method of a semiconductor device. This method is featured by preparing, in a chip; a calibration circuit including a replica circuit which has the same configuration as an output driver of a semiconductor device, providing the replica circuit with voltage conditions that allow the maximum current to flow through the output driver (the voltage conditions are the same as conditions of the read-out) and controlling an impedance of the replica circuit so that the impedance of the replica circuit coincides with a resistance value of an external resistor having an end or a first end connected an external terminal.

A second example relates to a semiconductor device. This semiconductor device has a calibration circuit including a replica circuit having the same configuration as an output driver connected to a first external terminal. The replica circuit is connected between a first power source terminal and a second external terminal both of which are given either one of a first voltage and a second voltage (corresponding to high-level data and low-level data outputted from the output driver). The calibration circuit also includes a comparator operable to compare a voltage of the second external terminal with a voltage of a second power source corresponding to the other voltage of the first voltage and the second voltage and a control circuit operable to control an impedance value of the replica circuit depending upon an output of the comparator.

A third example relates to a control method of a semiconductor device. During a first calibration operation of this method, calibration information corresponding to at least two different ambient temperatures is obtained by the use of a calibration circuit, and the calibration information is stored as table parameters in a memory unit. During a second calibration operation of this method, each table parameter is read from the memory unit depending upon the ambient temperature, and an impedance value of an output driver is set based on the read table parameter. The first calibration operation is performed during shipment inspection by a vendor who has manufactured the semiconductor device. The second calibration operation is performed by a user who uses the semiconductor device mounted on a system, namely, is performed in the system. One of the features of the present invention is specified by using the first calibration operation and the second calibration operation.

Preferred embodiments of the present invention will be described below in detail with reference to the accompanying drawings.

Figure 1:
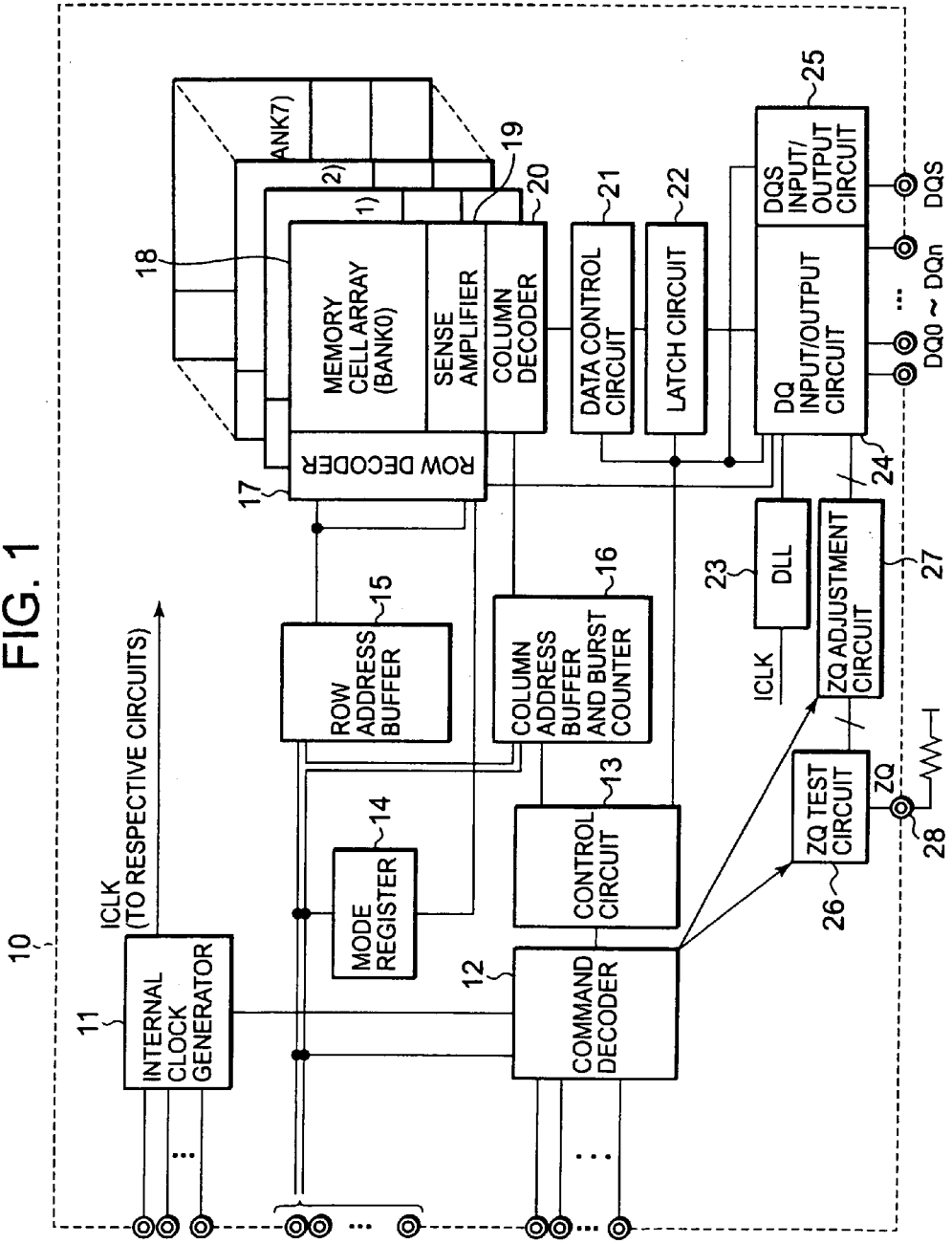
FIG. 1 is a block diagram showing a general configuration of a semiconductor device according to a first embodiment of the present invention.

FIG. 1 shows an example of a configuration of a semiconductor device according to a first embodiment of the present invention. A semiconductor device 10 shown in FIG. 1 is a dynamic random access memory (DRAM). The semiconductor device 10 includes an internal clock generator 11, a command decoder 12, a control circuit 13, a mode register 14, a row address buffer 15, a column address buffer and burst counter 16, row decoders 17, memory cell arrays 18, sense amplifiers. 19, column decoders 20, a data control circuit 21, a latch circuit 22, a delay locked loop (DLL) 23, a data signal (DQ) input/output circuit 24, a data strobe signal (DQS) input/output circuit 25, a zero quotient (ZQ) test circuit 26, and a ZQ adjustment circuit 27.

The data signal (DQ) input/output circuit 24 includes output transistors (not shown) respectively connected to a plurality of external terminals DQi (first external terminals) for outputting internal data from the DQ input/output circuit 24 and input transistors (not shown) for inputting external data to the DQ input/output circuit 24.

The DQS input/output circuit 25 is configured in the same manner as the DQ input/output circuit 24.

The ZQ test circuit 26 is connected to a ZQ terminal 28 serving as an external terminal (second external terminal).

The aforementioned output transistors are formed of a plurality of CMOS inverters with drains connected to the external terminals (DQi) in common.

In a calibration operation described later, each impedance of the CMOS inverters is matched with the impedance of a resistance element provided outside of the semiconductor device. In the calibration, PMOS transistors and NMOS transistors of the CMOS inverters are individually adjusted in impedance. A pull-up replica circuit 202 and a pull-down replica circuit 212, which will be described with reference to FIG. 2 later, correspond to the PMOS transistors and the NMOS transistors of the CMOS inverters, respectively. Those replica circuits 202 and 212 have the same configuration as each other.

Now, the ZQ test circuit 26 calibrates the DQ input/output circuit 24 and the DQS input/output circuit 25. One circuit of the DQS input/output circuit 25 and a plurality of circuits of the DQ input/output circuit 24 are handled as one set. If the impedance value of the output driver of the DQS input/output circuit 25 is mismatched with the impedance values of a plurality of output drivers corresponding to the plurality of circuits of the DQ input/output circuit 24, then data outputted from the DQ input/output circuit 24 cannot be latched with high accuracy by a receiver of another semiconductor device to which those data are inputted.

In the semiconductor device 10, parts other than the ZQ test circuit 26 and the ZQ adjustment circuit 27 are not directly related to the present invention. Therefore, the details of those parts would be omitted herein. The ZQ test circuit 26 and the ZQ adjustment circuit 27 will mainly be described below. Operations of the ZQ test circuit 26 and the ZQ adjustment circuit 27 are implemented by an external command from the command decoder 12 or under control of the control circuit 13.

Figure 2:
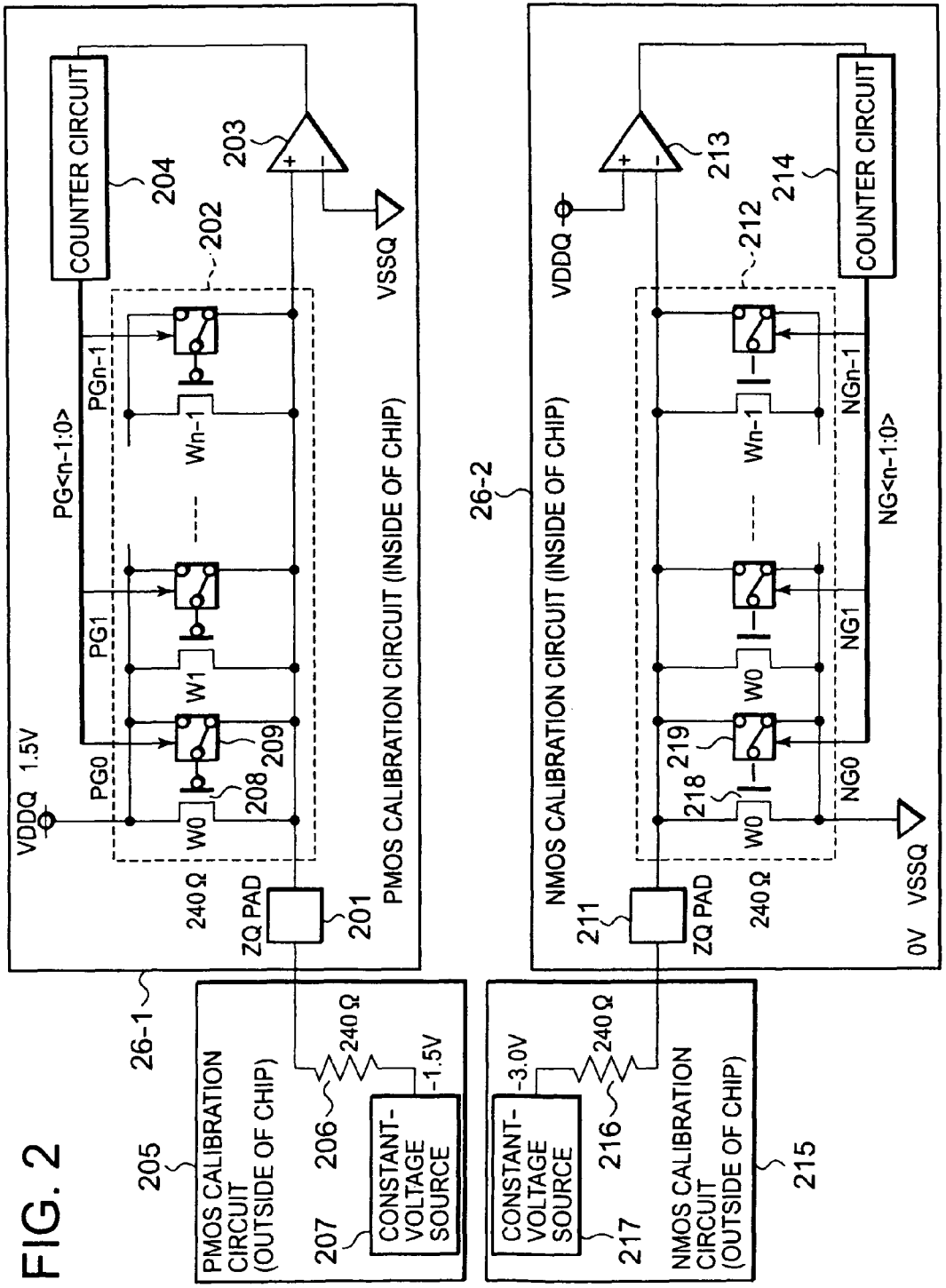
FIG. 2 is a circuit diagram showing an internal configuration of a ZQ test circuit included in the semiconductor device of FIG. 1.

Referring to FIG. 2, the ZQ test circuit 26 includes a P-channel MOS transistor (PMOS) calibration circuit 26-1 in a chip and an N-channel MOS transistor (NMOS) calibration circuit 26-2 in the chip.

The PMOS calibration circuit 26-1 includes a (pull-up) replica circuit 202 connected between a terminal of a first power source voltage (a higher power source voltage VDDQ in this example, e.g., 1.5 V) and a ZQ pad 201, a comparator 203 operable to compare a voltage of the ZQ pad 201 with a second power source voltage (a lower power source voltage VSSQ in this example, e.g., 0 V), and a counter circuit (control circuit) 204 operable to control the impedance of the replica circuit 202 in response to an output of the comparator 203.

The ZQ pad 201 is connected to the external terminal (the ZQ terminal or the second external terminal 28 in FIG. 1). For a calibration operation (in a first calibration mode described later), the second external terminal is connected to an external PMOS calibration circuit 205 as illustrated in FIG. 2. The external PMOS calibration circuit 205 includes an external resistor 206 having a predetermined resistance value (e.g., 240 Ω±1%) and a constant-voltage source 207 connected to one end of the external resistor 206 for generating a constant voltage. The external PMOS calibration circuit 205 is included in a tool used for shipment inspection by a vendor who manufactures semiconductor devices. Thus, after the semiconductor device has been shipped and mounted on a system, the external PMOS calibration circuit 205 is unnecessary for the system and is not present on the system.

The constant voltage generated by the constant-voltage source 207 is determined such that the ZQ pad 201 has a voltage of 0 V when the impedance of the replica circuit 202 (on-resistance) is equal to the value of the external resistor 206. Those conditions are the same as the conditions of the voltages at the time of the read-out (high-level output), at which the output transistors of the data signal (DQ) input/output circuit 24 output internal data from the DQ input/output circuit 24. The internal data mean transition from a low level to a high level. Therefore, in this example, the constant voltage generated by the constant-voltage source 207 has the same absolute value as the power source voltage VDDQ but a polarity opposite to that of the power source voltage VDDQ. If the power source voltage VDDQ is 1.5 V, the constant voltage generated by the constant-voltage source 207 is −1.5 V. In other words, the constant voltage generated by the constant-voltage source 207 is set to have an absolute value equal to twice the power source voltage VDDQ. Accordingly, conditions of voltages between source terminals and drain terminals of a plurality of transistors 208 in the replica circuit 202 are determined based upon voltages between source terminals and drain terminals of (first) transistors for outputting high-level data. The first transistors are included in the output drivers (output transistors) of the data signal (DQ) input/output circuit 24 and connected to the first external terminals (DQi). The voltages between the source terminals and the drain terminals of the transistors 208 are based on a difference voltage between a first voltage and a second voltage corresponding to high-level data and low-level data outputted from the output transistors, respectively.

The replica circuit 202 has the same configuration as pull-up circuits of output drivers (pull-up output drivers) included in the DQ input/output circuit 24 and the DQS input/output circuit 25. Specifically, the replica circuit 202 includes n PMOS transistors 208 connected in parallel between the first power source voltage (VDDQ) and the ZQ pad 201 and n change-over switches 209 connected to gates of those PMOS transistors 208 where n is an integer equal to or larger than 2. Each of the change-over switches 209 supplies either a voltage of the first power source voltage (VDDQ) or a voltage of the ZQ pad 201 to the gate of the corresponding PMOS transistor 208 in response to an output of the counter circuit 204 (control signal PG). In a state as shown in FIG. 2 in which the external PMOS calibration circuit 205 has been connected to the PMOS calibration circuit 26-1 included in the chip, each of the PMOS transistors 208 is turned off when the first power source voltage (VDDQ) is supplied to the gate of the PMOS transistor 208. Each of the PMOS transistors 208 is turned on when the voltage of the ZQ pad 201 is supplied to the gate of the PMOS transistor 208. The number of the PMOS transistors 208 being turned on determines the impedance value (namely, on-resistance) of the replica circuit 202.

Therefore, the impedance value of the replica circuit 202 that is determined by the calibration operation (first calibration operation) corresponds to the output of the counter circuit 204 (control signal PG) at that time and is equal to the impedance value of the output drivers (high potential side). In the present embodiment, the impedance value of the output drivers is not matched during the first calibration operation but the output of the counter circuit 204 (control signal PG) at the aforementioned point of time is stored in an output size ROM (memory unit) 305 (FIG. 5), which will be described later.

When a second calibration operation is commanded by another semiconductor device that issues a command for calibration of the semiconductor device 10, then the semiconductor device 10 reads information of the corresponding control signal PG from the ROM (memory unit) 305 and controls the impedance value of the output drivers. Thus, the replica circuit 202 is not used during the second calibration operation.

The comparator 203 compares the voltage of the ZQ pad 201 with the second power source voltage (VSSQ) and outputs the comparison result (a high level or a low level) to the counter circuit 204.

The counter circuit 204 performs a count operation in response to a clock (ICLK) while the output of the comparator 203 has a high level. The counter value of the counter circuit 204 is transmitted as the control signal PG to each of the change-over switches 209 and used to control those change-over switches 209. This control is performed such that the number of the PMOS transistors 208 being turned on is decreased as the counter value of the counter 204 increases. If the number of the PMOS transistors 208 being turned on is decreased, the impedance of the replica circuit 202 increases, whereas the voltage of the ZQ pad 201 decreases. If the voltage of the ZQ pad 201 accordingly becomes equal to or lower than the second power source voltage (VSSQ), the output of the comparator 203 changes into a low level, so that the counter circuit 204 stops the count operation. The counter value of the counter circuit 204 that has stopped the count operation is stored as calibration information (impedance control information may be called plural pieces of calibration information also) in a memory unit of the ZQ adjustment circuit 27 and utilized for setting and adjusting the impedance of the pull-up circuits of the output drivers (in a second calibration mode described later). For example, the impedance of the pull-up circuits of the output drivers is set and adjusted by setting and adjusting the number of activated transistors included in the pull-up circuit.

Meanwhile, the NMOS calibration circuit 26-2 includes a (pull-down) replica circuit 212 connected between a first power source voltage (a low power source voltage VSSQ in this example, e.g., 0 V) and a ZQ pad 211, a comparator 213 operable to compare a voltage of the ZQ pad 211 with a second power source voltage (a high power source voltage VDDQ in this example, e.g., 1.5 V), and a counter circuit (control circuit) 214 operable to control the impedance of the replica circuit 212 depending upon an output of the comparator 213.

The ZQ pad 211 is connected to another external terminal (not shown) that is different from the external terminal connected to the ZQ pad 201 but that would be collectively called the second external terminal also. For a calibration operation (in the first calibration mode), this external terminal is connected to an external NMOS calibration circuit 215.

The ZQ pad 211 may be connected to the external terminal connected to the ZQ pad 201 (the ZQ terminal 28 in FIG. 1). In such a case, when a calibration operation is performed, the external PMOS calibration circuit 205 and the external NMOS calibration circuit 215 are switched for the connection by a switching control operation (not shown). The external NMOS calibration circuit 215 is included in a tool used for shipment inspection by a vendor who manufactures semiconductor devices. Thus, after the semiconductor device has been shipped and mounted on a system, the external NMOS calibration circuit 215 is unnecessary for the system and is not present on the system.

The external NMOS calibration circuit 215 includes an external resistor 216 having a predetermined resistance value (e.g., 240 Ω±1%) and a constant-voltage source 217 connected to one end of the external resistor 216 for generating a constant voltage.

The constant voltage generated by the constant-voltage source 217 is determined such that the ZQ pad 211 has a voltage of 0 V when the impedance of the replica circuit 212 (on-resistance) is equal to the value of the external resistor 216. Those conditions are the same as the conditions of the voltages at the time of the read-out (low-level output), at which the output transistors of the data signal (DQ) input/output circuit 24 output internal data from the DQ input/output circuit 24. The internal data mean transition from a high level to a low level. Therefore, in this example, the constant voltage generated by the constant-voltage source 217 is set to be twice the power source voltage VDDQ.

If the power source voltage VDDQ is 1.5 V, the constant voltage generated by the constant-voltage source 217 is 3.0 V. Accordingly, conditions of voltages between source terminals and drain terminals of a plurality of transistors 218 in the replica circuit 212 are determined based upon voltages between source terminals and drain terminals of first transistors for outputting low-level data. The first transistors are included in the output drivers (output transistors) of the data signal (DQ) input/output circuit 24 and connected to the first external terminals (DQi). The voltages between the source terminals and the drain terminals of the transistors 218 are based on a difference voltage between a first voltage and a second voltage which correspond to high-level data and low-level data outputted from the output transistors.

The replica circuit 212 has the same configuration as pull-down circuits of output drivers (pull-down output drivers) included in the DQ input/output circuit 24 and the DQS input/output circuit 25. Specifically, the replica circuit 212 includes n NMOS transistors 218 connected in parallel between the first power source voltage (VSSQ) and the ZQ pad 211 and n change-over switches 219 connected to gates of those NMOS transistors 218 where n is an integer equal to or larger than 2. Each of the change-over switches 219 supplies either a voltage of the first power source voltage (VSSQ) or a voltage of the ZQ pad 211 to the gate of the corresponding NMOS transistor 218 in response to an output of the counter circuit 214 (control signal NG). In a state as shown in FIG. 2 in which the external NMOS calibration circuit 215 has been connected to the NMOS calibration circuit 26-2 included in the chip, each of the NMOS transistors 218 is turned off when the first power source voltage (VSSQ) is supplied to the gate of the NMOS transistor 218. Each of the NMOS transistors 218 is turned on when the voltage of the ZQ pad 211 is supplied to the gate of the NMOS transistor 218. The number of the NMOS transistors 218 being turned on determines the impedance of the replica circuit 212. Therefore, the impedance value of the replica circuit 212 that is determined by the calibration operation (first calibration operation) corresponds to the output of the counter circuit 214 (control signal NG) at that time and is equal to each (lower) impedance value of the output drivers.

The comparator 213 compares the voltage of the ZQ pad 211 with the second power source voltage (VDDQ) and outputs the comparison result (a high level or a low level) to the counter circuit 214.

The counter circuit 214 performs a count operation in response to a clock (ICLK) while the output of the comparator 213 has a high level. The counter value of the counter circuit 214 is transmitted as the control signal NG to each of the change-over switches 219 and used to control those change-over switches 219. This control is performed such that the number of the NMOS transistors 218 being turned on is decreased as the counter value of the counter 214 increases. If the number of the NMOS transistors 218 being turned on is decreased, the impedance of the replica circuit 212 decreases, whereas the voltage of the ZQ pad 211 increases. If the voltage of the ZQ pad 211 accordingly exceeds the second power source voltage (VDDQ), the output of the comparator 213 changes into a low level, so that the counter circuit 214 stops the count operation. The counter value of the counter circuit 214 that has stopped the count operation is stored as calibration information in the memory unit of the ZQ adjustment circuit 27 and utilized for setting and adjusting the impedance of the pull-down circuits of the output drivers (in a second calibration mode). For example, the impedance of the pull-down circuits of the output drivers is set and adjusted by setting and adjusting the number of activated transistors included in the pull-down circuit.

Now, the ZQ adjustment circuit 27 will be described below with reference to FIG. 3. The ZQ adjustment circuit 27 has a function of detecting the temperature and a function of storing a parameter table. In the parameter table, each control value corresponding to the impedance value of the output transistors that have been matched with the resistance value of the external resistance element by the ZQ test circuit 26 is stored for each temperature. The ZQ adjustment circuit 27 shown in FIG. 3 has a configuration for obtaining the calibration information when the ambient temperature is relatively high (e.g., higher than 60° C.) and when the ambient temperature is relatively low (e.g., lower than 60° C.). If a calibration operation is performed for multiple ranges of the ambient temperature, then the ZQ adjustment circuit 27 may be configured as required.

Figure 3:
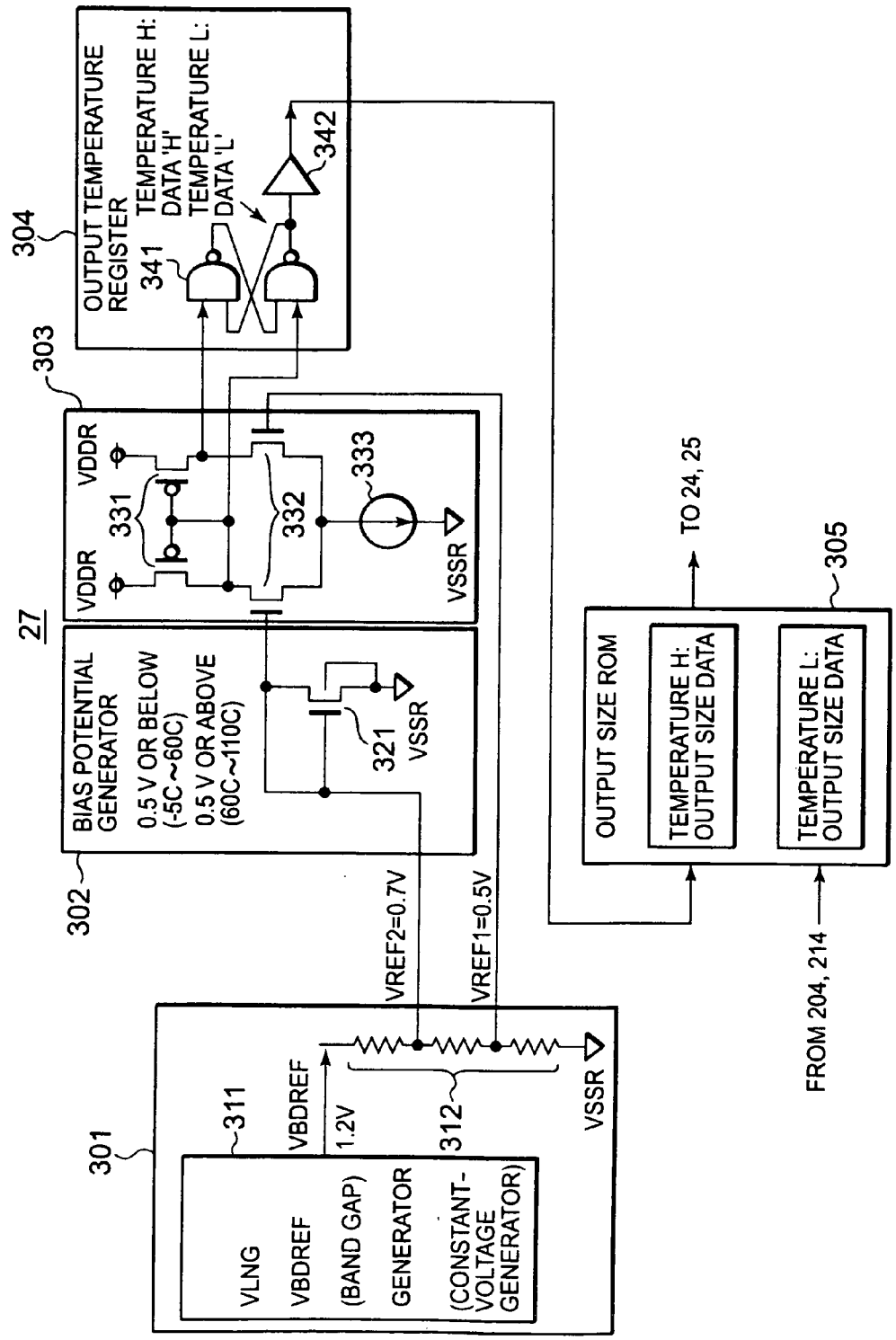
FIG. 3 is a circuit diagram showing an internal configuration of a ZQ adjustment circuit included in the semiconductor device of FIG. 1.

The ZQ adjustment circuit 27 shown in FIG. 3 includes a reference voltage generator 301, a bias potential generator 302, a comparison circuit 303, an output temperature register 304, and an output size ROM (memory unit) 305. The reference voltage generator 301, the bias potential generator 302, the comparison circuit 303, and the output temperature register 304 serve as a temperature detection circuit.

The reference voltage generator 301 includes a constant voltage generator 311 operable to generate a constant voltage VBDREF (e.g., 1.2 V) and a voltage divider 312 operable to divide the constant voltage VBDREF generated by the constant voltage generator 311. The voltage divider 312 is configured to generate a first reference voltage VREF1 at a first divided point (e.g., VREF1=0.5 V) and a second reference voltage VREF2 at a second divided point (e.g., VREF2=0.7 V). The first reference voltage VREF1 generated by the voltage divider 312 is inputted directly to one of a pair of input terminals of the comparison circuit 303. The second reference voltage VREF2 is inputted to the other input terminal of the comparison circuit 303 via the bias potential generator 302.

The bias potential generator 302 includes an NMOS transistor 321. The NMOS transistor 321 has a gate and a drain, which are supplied with the second reference voltage VREF2. The NMOS transistor 321 has a source connected to a low-potential power source voltage VSSR (e.g., 0 V). The bias potential generator 302 has temperature characteristics and serves as a temperature sensor. Specifically, the bias potential generator 302 adds a bias to the second reference voltage VREF2 depending upon the ambient temperature. For example, the bias potential generator 302 decreases the second reference voltage VREF2 to a voltage of 0.5 V or less when the ambient temperature is not more than 60° C. (between −5° C. and 60° C.). The potential generator 302 maintains the second reference voltage VREF2 at 0.5 V or more when the ambient temperature is not less than 60° C. (between 60° C. and 110° C.).

The comparison circuit 303 includes a pair of PMOS transistors 331, a pair of NMOS transistors 332, and a constant-current source 333, which are connected between a high-potential power source voltage VDDR and a low-potential power source voltage VSSR. The NMOS transistors 332 have gates connected to input terminals. Connection points of the PMOS transistors 331 and the NMOS transistors 332 are connected to output terminals.

The comparison circuit 303 compares the first reference voltage VREF1 and the second reference voltage VREF2 biased by the bias potential generator 302 with each other and outputs complementary signals corresponding to the comparison results.

The output temperature register 304 includes a pair of NAND circuits 341 and a delay circuit 342. The output temperature register 304 holds and outputs a high-level signal or a low-level signal according to the complementary signals from the comparison circuit 303. If the second reference voltage VREF2 is higher than the first reference voltage VREF1, the output temperature register 304 outputs a high-level signal, which indicates that the ambient temperature is relatively high. If the second reference voltage VREF2 is lower than the first reference voltage VREF1, the output temperature register 304 outputs a low-level signal, which indicates that the ambient temperature is relatively low.

The output size ROM 305 serves as a memory unit for storing the counter values of the counter circuits 204 and 214 of the ZQ test circuit 26 as calibration information (parameter table) in the form of plural pieces of calibration information. Specifically, the output size ROM 305 stores a plurality of sets of calibration information data corresponding to a plurality of ranges of the ambient temperature. In this example, the output size ROM 305 stores two sets of calibration information data corresponding to two ranges of the ambient temperature. The output size ROM 305 selectively outputs one of the stored sets of the calibration information data depending upon the output signal from the output temperature register 304. In this example, the output size ROM 305 stores therein calibration information data of the relatively high ambient temperature (Temperature H: output size data) and calibration information data of the relatively low ambient temperature (Temperature L: output size data). The output size ROM 305 outputs one of data sets depending upon the output of the output temperature register 304.

The calibration information outputted from the output size ROM 305 is transmitted to the DQ input/output circuit 24 and the DQS input/output circuit 25 and utilized for setting and adjusting the impedance of the output drivers of the DQ input/output circuit 24 and the DQS input/output circuit 25.

In the present embodiment, the bias potential generator 302 is used as a temperature sensor. Instead, other temperature sensors may be used. Furthermore, the temperature sensor may be provided outside of the semiconductor device 10.

Furthermore, it is preferable to operate the ZQ adjustment circuit 27 only in the second calibration mode, which will be described later. In such a case, the electric power consumption of the semiconductor device 10 can be reduced in modes other than the second calibration mode. Control signals and control elements for this purpose are not illustrated in the drawings. For example, the temperature detection circuit controls the activation according to commands inputted from the exterior of the semiconductor device 10 for adjusting the impedance of the output driver. Only some circuits in the temperature detection circuit that consume the most electricity may be controlled.

A calibration operation of the semiconductor device according to the present embodiment will be described with reference to FIGS. 4A to 4C in addition to FIGS. 1 to 3.

Types of the calibration operation of the present embodiment include a first calibration mode as shown in FIG. 4A and a second calibration mode as shown in FIG. 4B. The calibration operation in the first calibration mode is performed during wafer inspection in a manufacturing process of the semiconductor device. Specifically, the calibration operation in the first calibration mode is performed during a (shipment) inspection by a vendor who has manufactured the semiconductor device. This calibration operation may be similar to a calibration operation performed on a related semiconductor device. The calibration operation in the second calibration mode is performed when the semiconductor device normally operates (when a user uses the semiconductor device). In other words, a user who uses the semiconductor device mounted on a system requests the calibration operation in the second calibration mode. Specifically, the system (e.g., a controller as described later (semiconductor device 2)) performs the calibration operation in the second calibration mode. This calibration operation is entirely different from the calibration operation performed on a related semiconductor device. Specifically, the replica circuits that are used in the first calibration mode are not used in the second calibration mode. Each impedance value of the output drivers is adjusted with reference to the parameter table obtained in the first calibration mode and required for impedance adjustment.

In the first calibration mode, the ZQ test circuit 26 is used, whereas the ZQ adjustment circuit 27 is not used. At that time, the external PMOS calibration circuit 205 is connected to the PMOS calibration circuit 26-1, and the external NMOS calibration circuit 215 is connected to the NMOS calibration circuit 26-2 (Step S401). With the external calibration circuits 205 and 215 including the constant-voltage sources 207 and 217, the respective MOS transistors 208 and 218 of the replica circuits 202 and 212 can be supplied with voltage conditions that allow the maximum current to flow therethrough, i.e., a drain-source voltage VDS=|VDDQ| and a gate-source voltage VGS=|VDDQ|. The external calibration circuits 205 and 215 act as test tools. The external calibration circuits 205 and 215 are not mounted on a substrate of a system on which the semiconductor device has been mounted.

Next, the ambient temperature is set at a predetermined first temperature, e.g., −5° C. (Step S402). In the state in which the replica circuit 202 has been supplied with the voltage conditions that allow the maximum current to flow through the replica circuit 202, the number of the PMOS transistors 208 being turned on is controlled so that the impedance of the replica circuit 202 (on-resistance) is equal to the value of the external resistor 206 (240Ω). Thus, pull-up calibration information is obtained (Step S403).

Similarly, in the sate in which the replica circuit 212 has been supplied with the voltage conditions that allow the maximum current to flow through the replica circuit 212, the number of the NMOS transistors 218 being turned on is controlled so that the on-resistance of the replica circuit 212 is equal to the value of the external resistance 216 (240Ω). Thus, pull-down calibration information is obtained (Step S404).

The pull-up calibration information and the pull-down calibration information constitute a set of calibration information data.

In order to obtain calibration information for two or more different ambient temperatures (NO at Step S405), the process returns to Step S402. The ambient temperature is changed to a second predetermined temperature, e.g., 110° C. Then calibration information is acquired again. The temperature for setting is not limited to −5° C. and 110° C. Three or more temperatures may be used for setting.

When multiple sets of calibration information data (two sets in this example) corresponding to different ambient temperatures have been obtained (YES at Step S405), the multiple sets of calibration information data obtained are written as table parameters into the output size ROM 305 of the ZQ adjustment circuit 27 (ROM Programming Step S406). Step S406 may be performed for each of Steps S403 and S404. Alternatively, Step S406 may be performed after Step S404.

As described above, the calibration operation in the first calibration mode is performed in a state in which the maximum current flows through the transistors of the replica circuits. This simulates a state in which the output drivers actually operate (the read-out state). Accordingly, precise impedance information can be obtained with the same impedance as the impedance at the time of the read-out.

In the second calibration mode, the ZQ adjustment circuit 27 is used, whereas the ZQ test circuit 26 is not used. The calibration information written in the output size ROM 305 is used. Since the ZQ test circuit 26 is not used, the external calibration circuit 205 or 215 is not required.

In the second calibration mode, when power of the semiconductor device 10 is turned on (or the semiconductor device 10 is initialized) (Step S411), or when predetermined conditions are then satisfied (namely, REF time) (YES at Step 415), the ZQ adjustment circuit 27 is activated. The ZQ adjustment circuit 27 detects the ambient temperature (Step S412), the corresponding set of calibration information data is read from the multiple sets of calibration information data stored in the output size ROM 305 depending upon the detected temperature (Step S413). Then the read calibration information is outputted to the DQ input/output circuit 24 and the DQS input/output circuit 25. The predetermined conditions (REF time; YES at Step 415) refer to the time when the semiconductor device receives a command for performing impedance adjustment of the output drivers (impedance adjustment command) from a system that controls the semiconductor device (e.g., a controller device for controlling the semiconductor device). The REF time indicates a time period for referring to a command for an external controller to request a refresh function of holding memory information (information stored in memory cells) at predetermined intervals (refresh command). The impedance adjustment command and the refresh command are issued by a controller. Those commands are known commands (system commands) for controlling a semiconductor device, which are defined by the industrial group such as the JEDEC Solid State Technology Association. Hereinafter, the JEDEC Solid State Technology Association is simply referred to as JEDEC. The command (refresh command) and a self-refresh command for entry of self-refresh, which will be described later, are operation commands of the semiconductor device 10, which do not use the DQ input/output circuit 24 or the DQS input/output circuit 25.

Each of the DQ input/output circuit 24 and the DQS input/output circuit 25 sets or adjusts the impedance of the output driver (output MOS size) under control of the control circuit 13 (FIG. 1) based on the calibration information inputted from the ZQ adjustment circuit 27 (Step S414).

For example, the predetermined conditions are satisfied at Step 414 when a periodic calibration start signal is issued by an internal timer (not shown), a periodic external command such as a refresh command is inputted, or any change of the power source voltage VDDQ is detected by a voltage detector (not shown). For example, the internal timer operates in the self-refresh mode defined by JEDEC. The ZQ adjustment circuit 27 can perform the aforementioned control for reducing the electric power consumption in any time other than those modes.

Furthermore, detecting a temperature change that requires a calibration operation may be used for the predetermined conditions instead of the calibration start signal, the external command, and the change of the power source voltage VDDQ. In the above example, the predetermined conditions may be satisfied when the ambient temperature exceeds 60° C. or falls below 60° C. In other words, the ZQ adjustment circuit 27 may continuously detect temperature changes and adjust the impedance of the output drivers according to the detected changes of the ambient temperature. In this case, the aforementioned control for reducing the electric power consumption is not performed.

When a user uses the related semiconductor device, as shown in FIG. 4C, a calibration operation using an external resistance element (Steps S422 and S423) is performed on supplying electric power (Step S421) and the REF time (YES at Step S424).

As described above, in the second calibration mode, the output impedance is set and adjusted by using the calibration information stored in the output size ROM 305. This method does not require any external resistance. Therefore, a system including semiconductor device 10 can be simplified and reduced in cost. Specifically, no external resistance is required on a module substrate on which the semiconductor device 10 is mounted. Furthermore, it is possible to eliminate a current that would flow through the external resistance during a calibration operation. Thus, the electric power consumption of the system can be reduced. Moreover, a period of time required for a calibration operation can be shortened because only information is required to be read from the memory unit. As a result, it is possible to avoid a situation in which impedance matching cannot be completed within a calibration period defined by the system including the semiconductor device 10.

Next, advantageous effects of the semiconductor device according to the present embodiment will be described below.

In an actual semiconductor device, e.g., DDR3, which is defined by JEDEC, the impedance (on-resistance) of each output driver can be selected and set to be ⅙ or 1/7 (=40Ω or 34Ω) of an external resistor (240Ω). This can be implemented by seven circuits having the same configuration as the replica circuit 202 or 212. When those seven circuits are connected in parallel, the entire resistance is 1/7 of the resistance of each circuit. When six of the seven circuits are connected in parallel, the entire resistance is ⅙ of the resistance of each circuit.

Figures 5, 6:
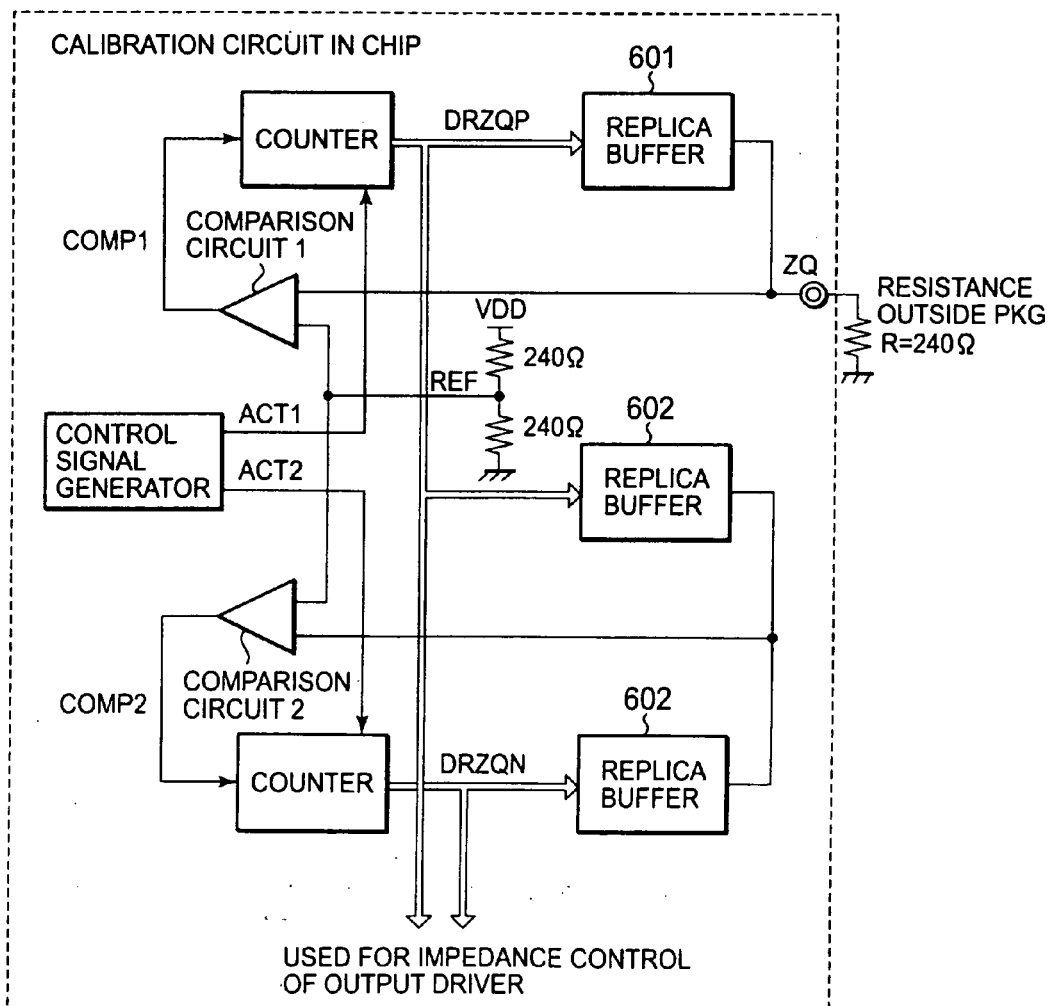
FIG. 5 is a diagram showing defined contents of fields A5 and A1 of a mode register in DDR3.
FIG. 6 is a block diagram showing a calibration circuit included in a related semiconductor device.

For setting those circuits, fields A5 and A1 of MR1 (mode register 1) included in the mode register 14 (FIG. 1) are used. The relationship among the values of the fields A5 and A1 and the impedance of the output driver is defined as shown in FIG. 5. An example of a semiconductor device according to the present embodiment was actually produced. The following description illustrates various characteristic measurement results of that semiconductor device in a case where the on-resistance of each output driver was set to be 1/7 (=34Ω) of the external resistor.

Figure 7A:
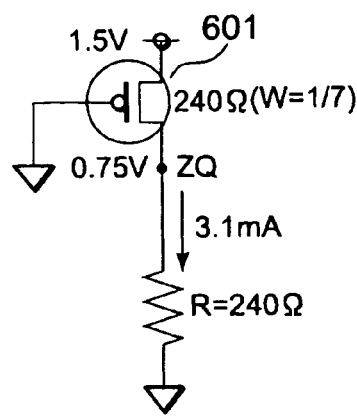
FIG. 7A is a circuit diagram showing a circuit formed during a pull-up calibration operation.
Figure 7B:
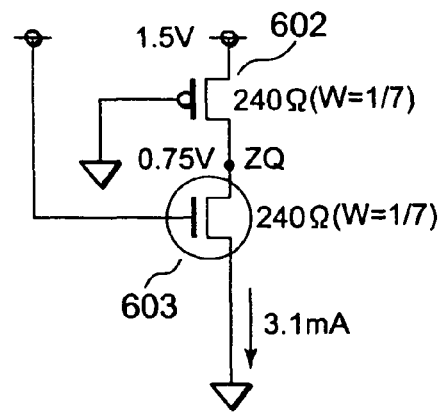
FIG. 7B is a circuit diagram showing a circuit formed during a pull-down calibration operation.

For the purpose of comparison, a semiconductor device having a related calibration circuit (Patent Document 1) as shown in FIG. 6 was also produced. The following description also illustrates various characteristic measurement results of the comparative semiconductor device in a case where the on-resistance of an output driver was set to be 34Ω. In the calibration circuit of FIG. 6, the reference voltage REF is equal to VDD/2 (=0.75 V). The reference voltage REF is inputted into a comparison circuit 1 having an input connected to the ZQ terminal 28. Furthermore, the reference voltage REF is also inputted to a comparison circuit 2. The comparison circuit 1 calibrates a replica buffer 601 and a replica buffer 602. The comparison circuit 2 calibrates a replica buffer 603. In this calibration circuit, a circuit shown in FIG. 7A is formed at the time of a PMOS calibration operation, and a circuit shown in FIG. 7B is formed at the time of an NMOS calibration operation.

Here, each of the replica buffers 601 and 602 includes PMOS transistors and corresponds to the replica circuit 202 illustrated in FIG. 2. The replica buffer 603 includes NMOS transistors and corresponds to the replica circuit 212 illustrated in FIG. 2.

Figure 8:
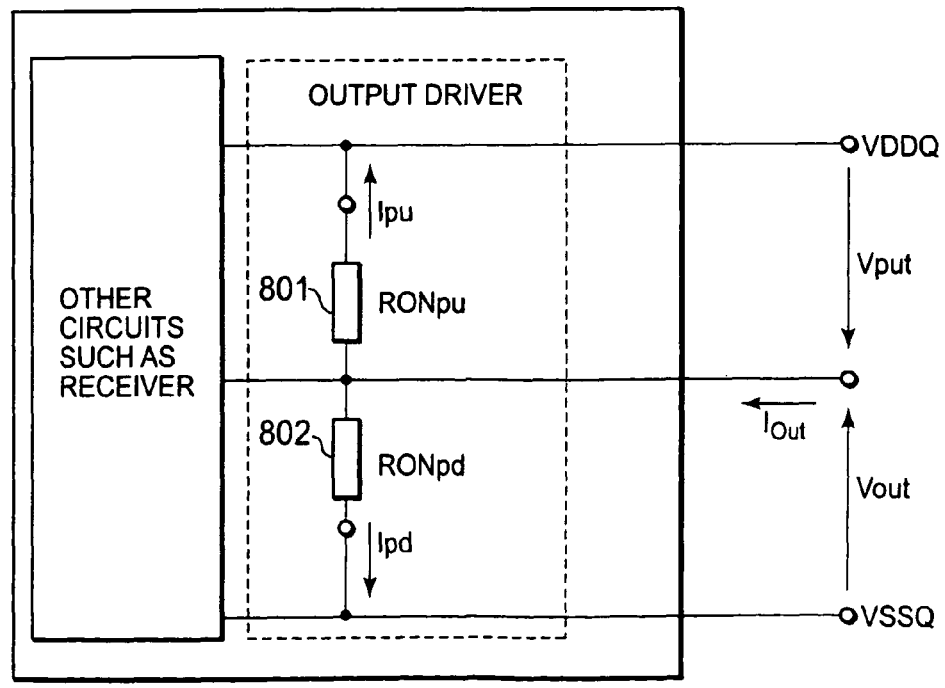
FIG. 8 is a diagram showing a model of an output driver of the semiconductor device shown in FIG. 1.

FIG. 8 is a diagram showing a model of an output driver. As shown in FIG. 8, the output driver includes a pull-up output driver (output transistor) 801 and a pull-down output driver (output transistor) 802 connected in series between a high-potential power source VDDQ and a low-potential power source VSSQ. An output terminal DQ is connected to a connecting point of the pull-up output driver 801 and the pull-down output driver 802.

Here, Vput denotes a voltage between the high-potential power source VDDQ and the output DQ, and Vout denotes a voltage between the low-potential power source VSSQ and the output DQ. Furthermore, RONpu denotes an on-resistance of the pull-up output driver, and RONpd denotes an on-resistance of the pull-down output driver. Additionally, Ipu denotes a current flowing through the pull-up output driver, and Ipd denotes a current flowing through the pull-down output driver.

Figure 9A:
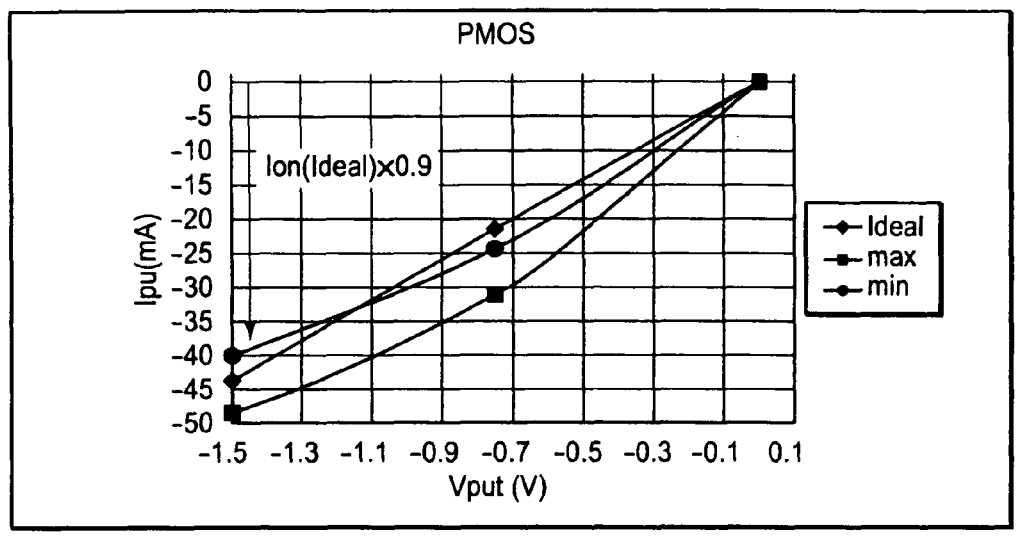
FIG. 9A is a graph showing voltage-current characteristics of a pull-up output driver in the semiconductor device of FIG. 1.
Figure 9B:
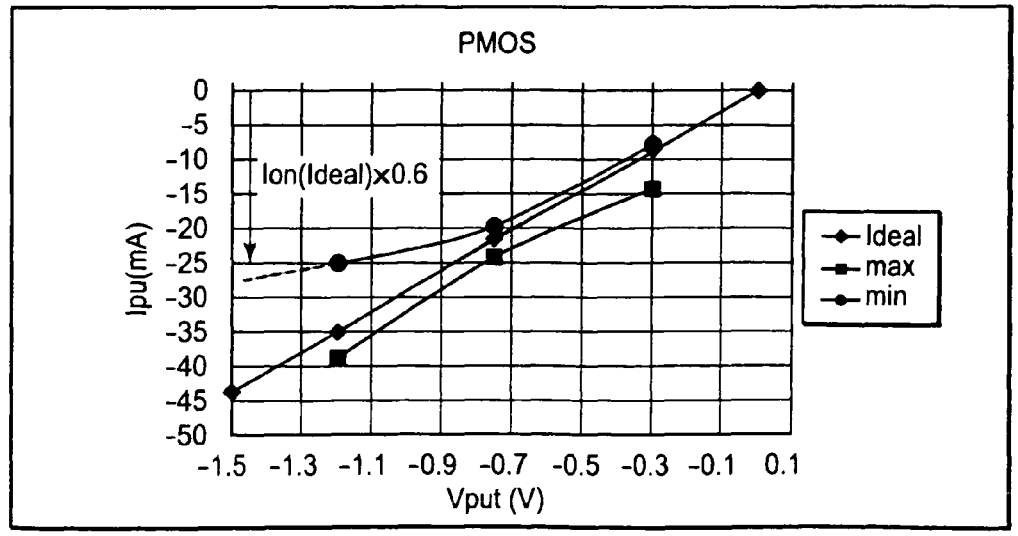
FIG. 9B is a graph showing voltage-current characteristics of a pull-up output driver of a related semiconductor device.

FIG. 9A shows voltage-current characteristics (Vput-Ipu) of the pull-up output driver (PMOS) of the semiconductor device according to the present embodiment. FIG. 9B shows voltage-current characteristics (Vput-Ipu) of the pull-up output driver (PMOS) of the related semiconductor device.

In FIGS. 9A and 9B, the diamond marks (♦) represent the ideal characteristics, the black squares (■) represent the maximum value of measurement results for a plurality of semiconductor devices produced, and the black circles (●) represent the minimum value of those measurement results.

As can be seen from FIG. 9A, when |Vput|=1.5 V (=1.0×VDDQ) in the semiconductor device according to the present embodiment, the on-resistance RONpu of the PMOS transistor was within a range of ±10% of the ideal value (=34Ω). This is because a calibration operation was performed on the semiconductor device according to the present embodiment under voltage conditions that allowed the maximum current to flow through the PMOS transistor. When |Vput|=0.75 V (=0.5×VDDQ), the on-resistance RONpu of the PMOS transistor was within a range from 70% to 90% of the ideal value (=34Ω). The voltage conditions that allow the maximum current to flow through the PMOS transistor included in the calibration circuit are voltage conditions under which PMOS transistors of output drivers included in the DQ input/output circuit 24 operate at the time of the read-out.

In contrast, as shown in FIG. 9B, when |Vput|=0.75 V (=0.5×VDDQ) in the related semiconductor device, the on-resistance RONpu of the PMOS transistor was within a range of ±10% of the ideal value (=34Ω). This is because a calibration operation was performed on the related semiconductor device with a reference voltage REF of 0.75 V. In the related semiconductor device, as |Vput| was remote from 0.75 V, variations of Ipu became large. Specifically, when |Vput|=1.2 V (=0.8×VDDQ), the on-resistance RONpu of the PMOS transistor was within a range from 90% to 140% of the ideal value (=34Ω). When |Vput|=0.3 V (=0.2×VDDQ), the on-resistance RONpu of the PMOS transistor was within a range from 60% to 110% of the ideal value (=34Ω).

Figure 10A:
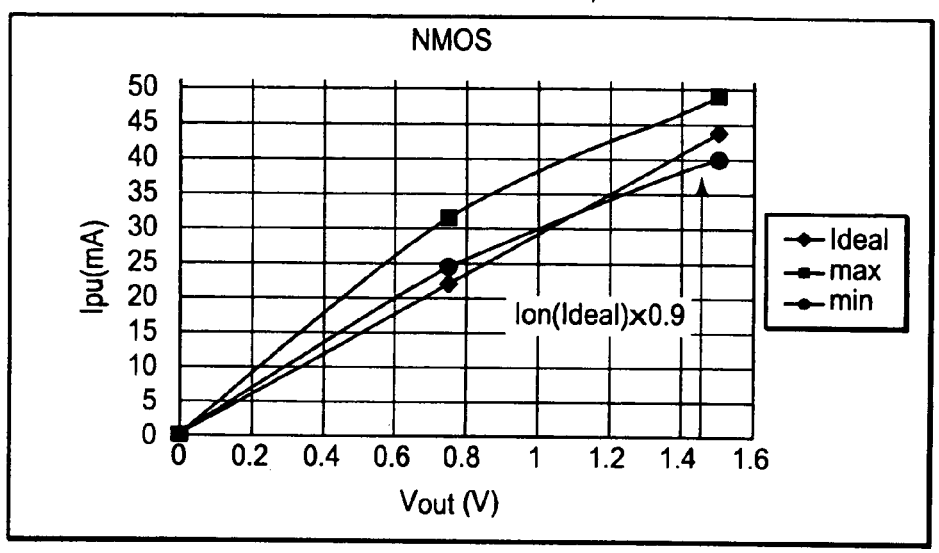
FIG. 10A is a graph showing voltage-current characteristics of a pull-down output driver in the semiconductor device of FIG. 1.
Figure 10B:
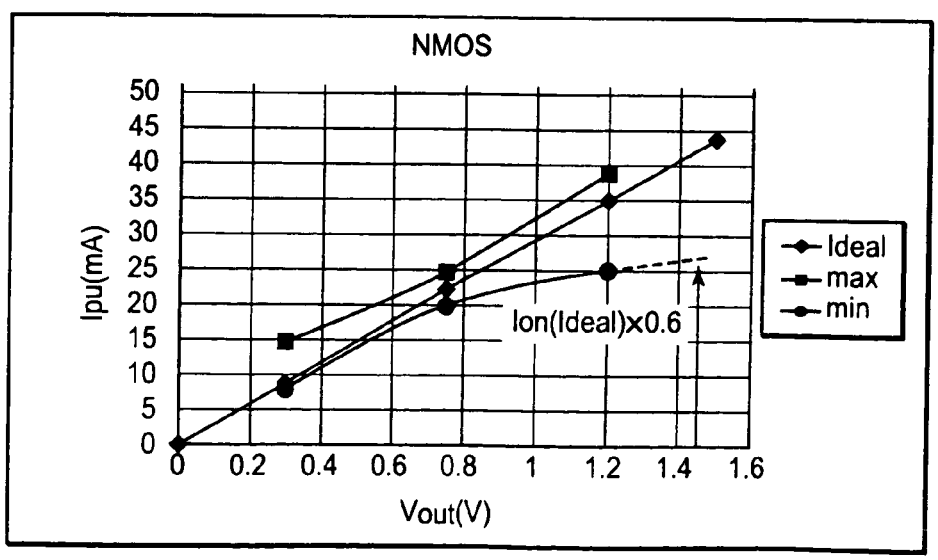
FIG. 10B is a graph showing voltage-current characteristics of a pull-down output driver of a related semiconductor device.

FIG. 10A shows voltage-current characteristics (Vout-Ipd) of the pull-down output driver (NMOS) of the semiconductor device according to the present embodiment. FIG. 10B shows voltage-current characteristics (Vout-Ipd) of the pull-down output driver (NMOS) of the related semiconductor device.

In FIGS. 10A and 10B, the diamond marks (♦) represent the ideal characteristics, the black squares (■) represent the maximum value of measurement results for a plurality of semiconductor devices produced, and the black circles (●) represent the minimum value of those measurement results.

As can be seen from FIG. 10A, when Vout=1.5 V (=1.0×VDDQ) in the semiconductor device according to the present embodiment, the on-resistance RONpd of the NMOS transistor was within a range of ±10% of the ideal value (=34Ω). This is because a calibration operation was performed on the semiconductor device according to the present embodiment under voltage conditions that allowed the maximum current to flow through the NMOS transistor. When Vout=0.75 V (=0.5×VDDQ), the on-resistance RONpd of the NMOS transistors was within a range from 70% to 90% of the ideal value (=34Ω). The voltage conditions that allow the maximum current to flow through the NMOS transistor included in the calibration circuit are voltage conditions under which NMOS transistor of the output drivers included in the DQ input/output circuit 24 operate at the time of the read-out.

In contrast, as shown in FIG. 10B, when Vout=0.75 V (=0.5×VDDQ) in the related semiconductor device, the on-resistance RONpd of the NMOS transistor was within a range of ±10% of the ideal value (=34Ω). This is because a calibration operation was performed on the related semiconductor device with a reference voltage REF of 0.75 V. In the related semiconductor device, as Vout was remote from 0.75 V, variations of Ipd became large. Specifically, when Vout=1.2 V (=0.8×VDDQ), the on-resistance RONpd of the NMOS transistor was within a range from 90% to 140% of the ideal value (=34Ω). When Vout=0.3 V (=0.2×VDDQ), the on-resistance RONpd of the NMOS transistor was within a range from 60% to 110% of the ideal value (=34Ω).

Figure 11A:
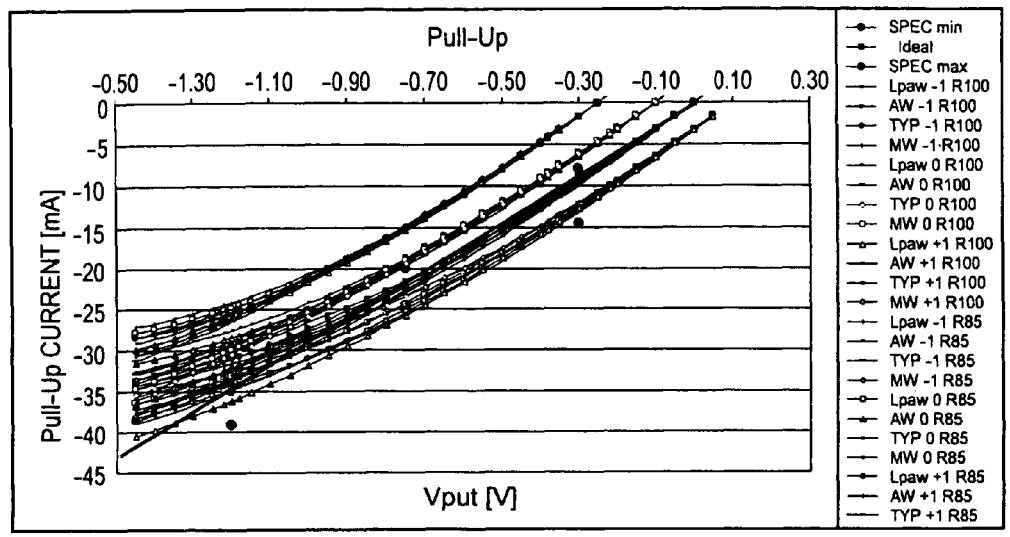
FIG. 11A is a graph showing voltage-current characteristics of a pull-up output driver of a related semiconductor device under various conditions.
Figure 11B:
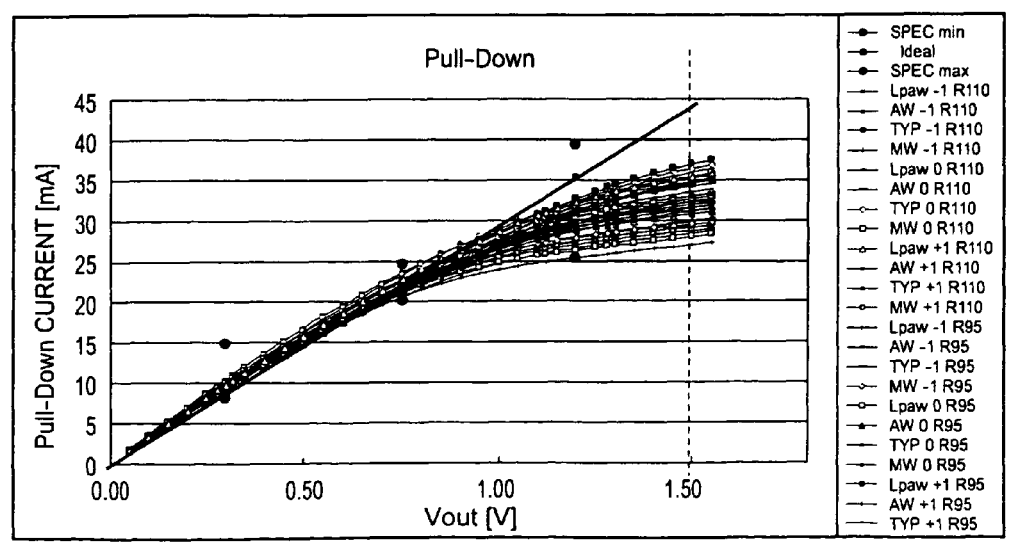
FIG. 11B is a graph showing voltage-current characteristics of a pull-down output driver of a related semiconductor device under various conditions.

FIGS. 11A and 11B are graphs showing the results of measuring voltage-current characteristics of the output drivers (the PMOS transistors and the NMOS transistors) of the related semiconductor device under various conditions. Those conditions included 36 conditions in total, which included four combinations of the power source voltage VDDQ [V] and the temperature Ti [° C.], three calibration code deviations (0 and ±1), and three variations of additional resistances Rp and Rn (0% and ±15%). FIG. 12A shows combinations of the power source voltage VDDQ [V] and the temperature Ti [° C.]. FIGS. 12B and 12C show circuits formed in the output driver at the time of the measurement.

As can be seen from FIGS. 11A and 11B, some related semiconductor devices could not flow a current of 30 mA with an operation voltage of 1.5 V while a desired current to flow was 44 mA. A semiconductor device according to the present embodiment can reduce such variations.

As described above, according to a semiconductor device of the present embodiment, variations of the on-resistance of the output driver are reduced under operational conditions (in a case where a voltage equal to VDDQ is applied). The variations of the on-resistance of the output driver cause differential delays in rising and falling of output signals. Such differential delays are illustrated in FIGS. 13A, 13B, 14A, and 14B.

Figure 13A:
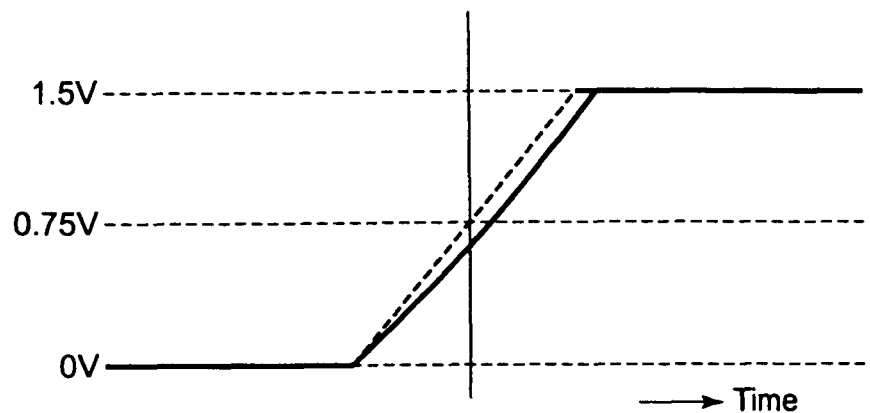
FIGS. 13A and 13B are diagrams respectively showing a rising waveform and a falling waveform of an output signal in the semiconductor device according to the embodiment of the present invention.
Figure 13B:
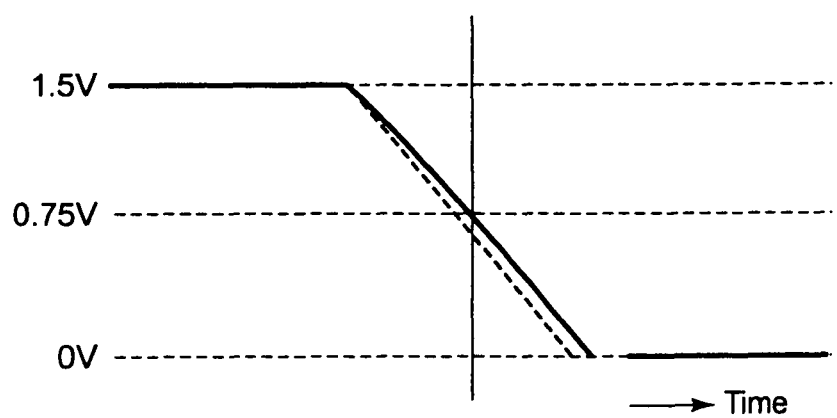

FIG. 13A shows an output signal waveform in a case of the maximum rising delay of the pull-up output driver (PMOS) of the semiconductor device according to the present embodiment. FIG. 13B shows an output signal waveform in a case of the maximum falling delay of the pull-down output driver (NMOS) of the semiconductor device according to the present embodiment. Each of RONpu and RONpd was 34

Ω×1.1. The broken lines in FIGS. 13A and 13B represent a case in which RONpu=RONpd=34 Ω.

Figure 14A:
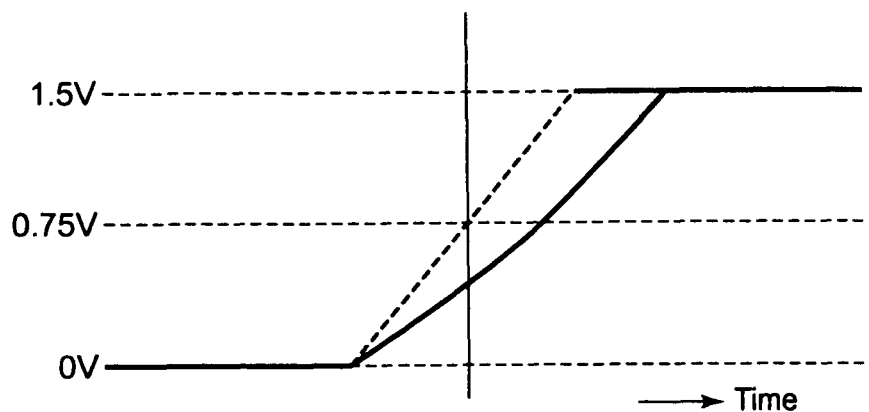
FIGS. 14A and 14B are diagrams respectively showing a rising waveform and a falling waveform of an output signal in a related semiconductor device.
Figure 14B:
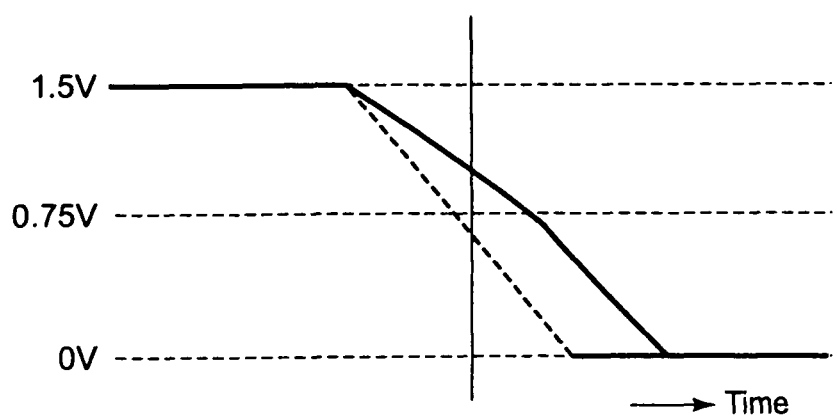

For the purpose of comparison, FIG. 14A shows an output signal waveform in a case of the maximum rising delay of the pull-up output driver (PMOS) of the related semiconductor device, and FIG. 14B shows an output signal waveform in a case of the maximum falling delay of the pull-down output driver (NMOS) of the related semiconductor device. In those cases, each of RONpu and RONpd was 34 Ω×1.4. The broken lines in FIGS. 14A and 14B represent a case in which RONpu=RONpd=34 Ω.

As is apparent from comparison FIGS. 13A and 13B with FIGS. 14A and 14B, the rising delay and the falling delay of the output signals were reduced in the semiconductor device according to the present embodiment. In other words, according to the present embodiment, variations in operational capability of output drivers can be reduced.

If the operational capability differs between the output driver for DQ signals and the output driver for DQS signals, then a delay time called a DQ-DQS skew is produced. According to the present embodiment, such a DQ-DQS skew can be reduced. Therefore, an effective data period can be lengthened so as to increase a transmission rate of signals outputted from the output drivers.

Next, a system according to a second embodiment of the present invention will be described below with reference to FIG. 15.

Figure 15:
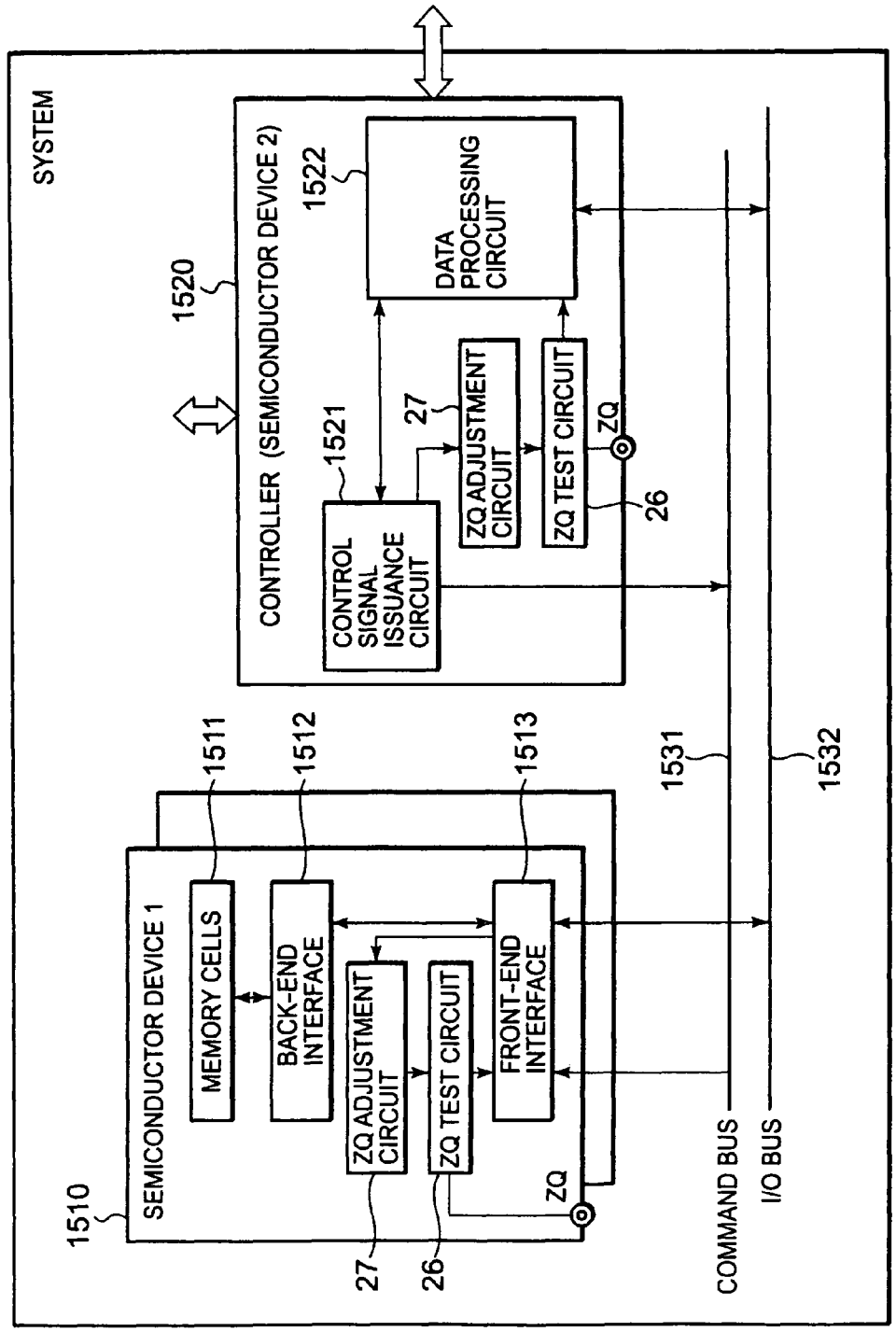
FIG. 15 is a block diagram showing a general configuration of a system according to a second embodiment of the present invention.

The system of FIG. 15 includes a plurality of first semiconductor devices 1510 and a second semiconductor device 1520. The first semiconductors devices 1510 are connected to the second semiconductor device 1520 by a command bus 1531 and a data input/output (I/O) bus 1532.

Each of the first semiconductor devices 1510 includes memory cells 1511, a back-end interface 1512, and a front-end interface 1513.

The second semiconductor device 1520 includes a control signal issuance circuit 1521 and a data processing circuit 1522. The second semiconductor device 1520 serves as a controller for controlling the first semiconductor devices 1510. Furthermore, the second semiconductor device 1520 has other circuits not shown in the system and interfaces for circuits outside of the system. The second semiconductor device 1520 controls the entire system.

The front-end interface 1513 of each of the first semiconductor devices 1510 and the data processing circuit 1522 of the second semiconductor device 1520 include a plurality of output drivers. In order to adjust the impedance (on-resistance) of each output driver, each of the semiconductor devices 1510 and 1520 includes circuits similar to the ZQ test circuit 26 and the ZQ adjustment circuit 27 mounted on the semiconductor device 10 of the first embodiment.

This system can be implemented with various electronic instruments such as personal computers, electronic communication devices, electronic products for transportations such as airplanes and automobiles, industry-oriented electronic products, and consumer-oriented electronic products. The ZQ test circuit 26 and the ZQ adjustment circuit 27 may be provided on all of the semiconductor devices of the system or on some of those semiconductor devices. When the ZQ test circuit 26 and the ZQ adjustment circuit 27 are provided on all of the semiconductor devices of the system, it is possible to reduce variations of the impedance (on-resistance) between the output drivers of the semiconductor devices and to thus achieve improvement in precision.

Next, a system according to a third embodiment of the present invention will be described below with reference to FIG. 16. The following description is focused on differences between this system and the system shown in FIG. 15.

Figure 16:
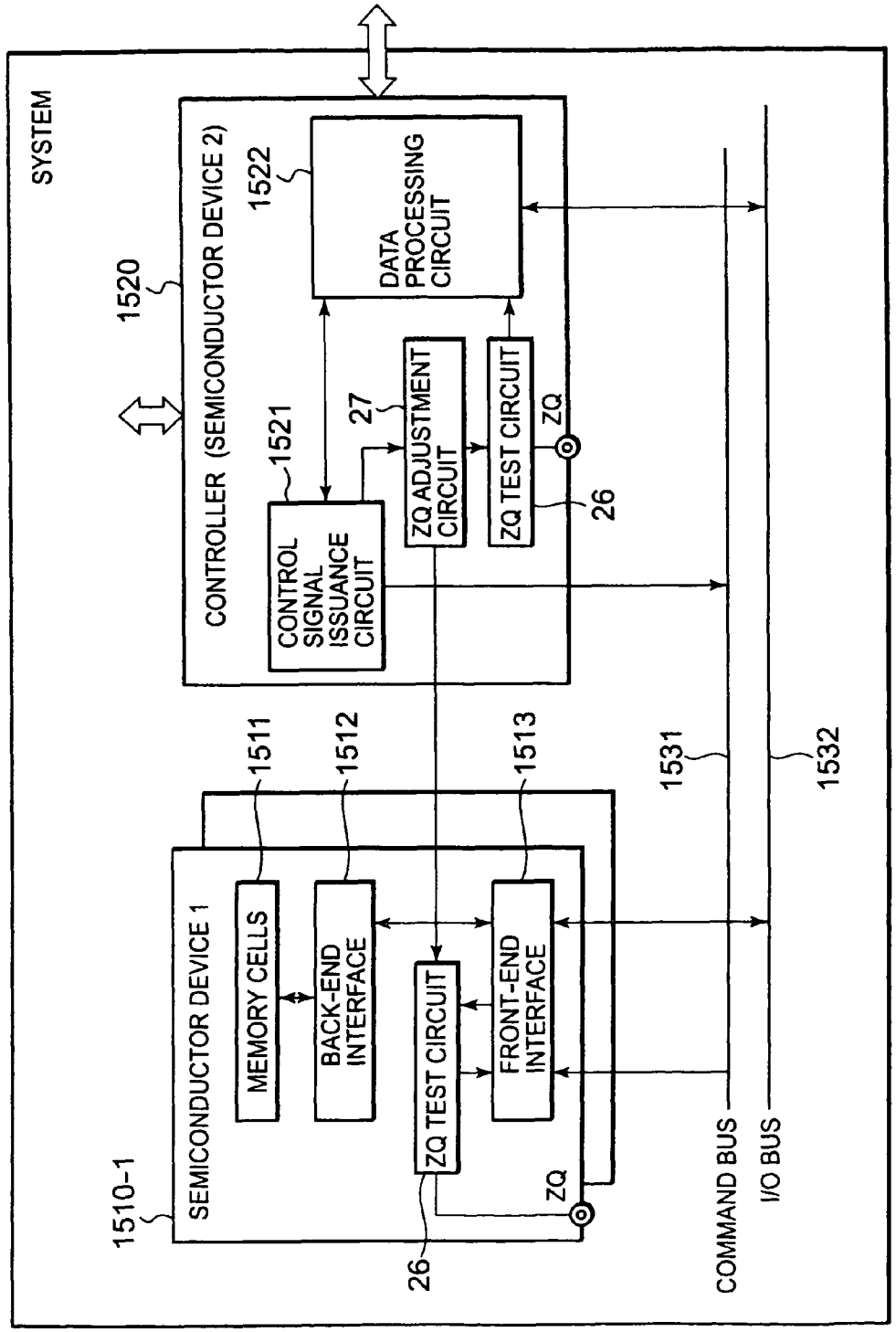
FIG. 16 is a block diagram showing a general configuration of a system according to a third embodiment of the present invention.

The system of FIG. 16 includes first semiconductor devices 1510-1, each of which has no ZQ adjustment circuit 27. The ZQ test circuit 26 of each of the first semiconductor devices 1510-1 is connected to the ZQ adjustment circuit 27 of the second semiconductor device (controller) 1520. That is, in the system according to the third embodiment, the ZQ adjustment circuit 27 of one of the semiconductor devices is used in common by other semiconductor devices.

Impedance adjustment of the output driver of each of the first semiconductor devices 1510-1 is performed with control information stored in a memory unit of the ZQ adjustment circuit 27 of the second semiconductor device 1520. In other words, the impedance of the output driver included in the front-end interface of the first semiconductor device 1510-1 is controlled based upon the control information stored in the ZQ adjustment circuit 27 of the second semiconductor device 1520.

Specifically, a vendor who has manufactured this system performs a first calibration operation during a test process using the replica circuits of the ZQ test circuits 26 and 27 of the semiconductor devices 1 and the semiconductor device 2 to obtain a plurality of table parameters. The vendor stores the table parameters in the ZQ adjustment circuit 27 of the semiconductor device 2. The table parameters correspond to the output drivers of the semiconductor devices 1 and 2, which have different manufacturing conditions and different electric characteristics. The aforementioned test tool is connected to each of the ZQ terminals of the semiconductor devices 1 and the semiconductor device 2 only at the time of a test process. The ZQ adjustment circuit 27 supplies information of the table parameter corresponding to the semiconductor device, which has been issued by the control signal issuance circuit 1521, to the corresponding ZQ test circuit. During a second calibration operation, the ZQ test circuit adjusts the impedance value of the corresponding output driver according to the information supplied by the ZQ adjustment circuit without use of the corresponding replica circuit. In this system, the semiconductor devices 1 and 2 are mounted on the same substrate. A temperature detection circuit is mounted at least on the ZQ adjustment circuit of the semiconductor device 2. If higher precision of the temperature is required for the semiconductor devices 1, the ZQ test circuit 26 of each of the semiconductor devices 1 may have a temperature detection function.

Thus, the ZQ adjustment circuit 27 of the second semiconductor device 1520 is used in common by the first semiconductor devices 1510-1. Accordingly, a trimming step of the ZQ adjustment circuit is not required during a wafer inspection process of the first semiconductor devices 1510-1. Therefore, the cost for manufacturing the semiconductor device 1 can be reduced.

Although the present invention has been described with some embodiments, the present invention is not limited to the above embodiments. Many modifications and variations may be made therein without departing from the spirit and scope of the present invention.

For example, the above embodiments disclose a case where the semiconductor devices 1 are formed of a semiconductor memory (DRAM). However, the fundamental technical concept of the present application is not limited to that case. Thus, the present invention is generally applicable to semiconductor products having various functions, such as a central processing unit (CPU), a micro control unit (MCU), a digital signal processor (DSP), an application specific integrated circuit (ASIC), and an application specific standard product (ASSP). The semiconductor devices 1 and 2 may be formed of any combination of the aforementioned semiconductor products having various functions. Furthermore, devices to which the present invention has been applied are applicable to semiconductor devices with technology including system-on-a-chip (SOC), multi-chip package (MCP), and package-on-package (POP). In the above embodiments, MOS transistors are illustrated. Nevertheless, field effect transistors (FETs) may be used for the transistors. Specifically, various types of FETs including a metal oxide semiconductor (MOS), a metal-insulator semiconductor (MIS), and a thin film transistor (TFT) may be used for the transistors. Furthermore, a bipolar transistor may partially be included in the semiconductor devices.

Moreover, the circuit configuration of various circuits including the ZQ test circuit and the ZQ adjustment circuit is not limited to the circuit configuration illustrated in the above embodiments.

Furthermore, the disclosed elements may be combined or selected in various ways within the scope of the appended claims of the present invention. In other words, the present invention includes a variety of variations and modifications that would be apparent to those skilled in the art from the entire disclosure and technical concept including the appended claims. At any rate, it is apparent that the present invention is not limited to the above-embodiments but may be modified and changed without departing from the scope and the spirit of the present invention.

What is claimed is:

1. A calibration method of calibrating an impedance value of an output driver which is included in a semiconductor device and which is connected to a first external terminal of the semiconductor device, the semiconductor device including a calibration circuit comprising a replica circuit which is identical in structure with the output driver and which is connected to a second external terminal of the semiconductor device, the method comprising:
    supplying, to the replica circuit, a voltage condition on which the output driver causes a maximum current to flow; and
    controlling an impedance value of the replica circuit so that the impedance value of the replica circuit becomes equal to a resistance value of an external resistor which includes a first end connected to the second external terminal and which is placed outside of the semiconductor device and, thereby, the impedance value of the output driver is matched with the impedance value of the replica circuit,
    wherein the voltage condition is defined by a voltage between a source terminal and a drain terminal of a first transistor which is included in the output driver and which is connected to the first external terminal, and
    wherein the voltage between the source terminal and the drain terminal of the first transistor is defined by a difference voltage between first and second voltages which correspond to high-level data and low-level data outputted from the output driver, respectively.

2. The calibration method as claimed in claim 1, comprising:
    supplying the difference voltage to the second external terminal so as to realize the voltage condition.

3. The calibration method as claimed in claim 2, comprising:
    connecting a constant-voltage source to a second end of the external resistor to realize the voltage condition.

4. The calibration method as claimed in claim 3, wherein a voltage of the constant-voltage source is equal to twice the difference voltage.

5. A calibration method of calibrating an impedance value of an output driver which is included in a semiconductor device and which is connected to a first external terminal of the semiconductor device, the semiconductor device including a calibration circuit comprising a replica circuit which is identical in structure with the output driver and which is connected to a second external terminal of the semiconductor device, the method comprising:
    supplying, to the replica circuit, a voltage condition on which the output driver causes a maximum current to flow;
    controlling an impedance value of the replica circuit so that the impedance value of the replica circuit becomes equal to a resistance value of an external resistor which includes a first end connected to the second external terminal and which is placed outside of the semiconductor device and, thereby, the impedance value of the output driver is matched with the impedance value of the replica circuit;
    obtaining control information of the replica circuit which is produced when the impedance value of the replica circuit is coincident with the resistance value of the outside resistor; and
    storing the control information in a predetermined memory section which is placed within the semiconductor device and/or within a system including the semiconductor device.

6. The calibration method as claimed in claim 5, wherein the replica circuit includes a plurality of second transistors connected to the second external terminal, and
    wherein the control information is specified by information that controls the number of activated transistors among the second transistors included in the replica circuit.

7. The calibration method as claimed in claim 6, wherein each of the control information is obtained about at least two different temperatures.

8. The calibration method as claimed in claim 7, further comprising:
    reading out the control information corresponding to a detected temperature from each control information which corresponds to each temperature and which is stored in the memory section; and
    controlling the impedance value of the output driver in response to the readout control information without using the replica circuit.

9. The calibration method as claimed in claim 8, further comprising:
    executing, in a test process of testing the semiconductor device, a first calibration which obtains the control information of the replica circuit; and
    executing, in the system including the semiconductor device, a second calibration which reads the control information corresponding to the detected temperature.

10. A semiconductor device comprising:
    a first external terminal;
    a second external terminal;
    an output driver comprising an output transistor and connected to the first external terminal;
    a replica circuit;
    a comparator; and
    a control circuit,
    wherein:
    the output driver includes a pull-up circuit and a pull-down circuit, the pull-up circuit outputting a first voltage corresponding to high-level data to the first external terminal, the pull-down circuit outputting a second voltage corresponding to low-level data to the first external terminal, the replica circuit configuration being identical to the pull-up circuit or the pull-down circuit, the replica circuit further connecting between the second external terminal and a first power source terminal, a voltage of the first power source terminal corresponding to one of the first voltage and the second voltage, wherein:

the comparator is operable to compare a voltage of the second external terminal with a voltage of a second power source terminal, a voltage of the second power source terminal corresponding to the other of the first voltage and the second voltage; and the control circuit is operable to control an impedance value of the replica circuit depending upon an output of the comparator so as to match an impedance value of the output driver with the impedance value of the replica circuit.

11. The semiconductor device as claimed in claim 10, further comprising:

an adjustment circuit which includes a memory unit that stores a control information from the control circuit, the control information being obtained by the comparator when the voltage of the second external terminal is equal to the voltage of the second power source.

12. The semiconductor device as claimed in claim 11, wherein the adjustment circuit further includes a temperature detection circuit operable to detect a temperature, the memory unit includes a plurality of pieces of the control information corresponding to a plurality of temperatures and outputs the control information corresponding to the detected temperature, and the adjustment circuit adjusts the impedance value of the output driver with the control information without use of the replica circuit.

13. The semiconductor device as claimed in claim 12, wherein activation of the temperature detection circuit is controlled by a command inputted from an external of the semiconductor device that adjusts the impedance of the output driver or by supply of power to the semiconductor device.

14. The semiconductor device as claimed in claim 13, wherein the command is an operation command of the semiconductor device that controls the output driver with inactivation or without use of the output driver.

15. The semiconductor device as claimed in claim 14, wherein the command is a refresh command which refreshes information of memory cells included in the semiconductor device.

16. A system comprising:

a first semiconductor device of the semiconductor device as recited in claim 13; and a second semiconductor device including a command issuance circuit operable to issue the command to the first semiconductor device.

17. The system as recited in claim 16, wherein the second semiconductor device further includes a first replica circuit, a first comparator, and a first control circuit corresponding to the replica circuit, the comparator, and the control circuit of the first semiconductor device, and the command issuance circuit is connected to the first control circuit.

18. A system comprising:

a first semiconductor device and a second semiconductor device, each of the first semiconductor device and the second semiconductor device including:

a first external terminal, a second external terminal, an output driver comprising an output transistor and connected to the first external terminal, a replica circuit, a comparator; and a control circuit, wherein:

the output driver includes a pull-up circuit and a pull-down circuit, the pull-up circuit outputting a first voltage corresponding to high-level data to the first external terminal, the pull-down circuit outputting a second voltage corresponding to low-level data to the first external terminal, the replica circuit configuration being identical to the pull-up circuit or the pull-down circuit, the replica circuit further connecting between the second external terminal and a first power source terminal, a voltage of the first power source terminal corresponding to one of the first voltage and the second voltage, the comparator being operable to compare a voltage of the second external terminal with a voltage of a second power source terminal, a voltage of the second power source terminal corresponding to the other voltage of the first voltage and the second voltage, and the control circuit being operable to control an impedance value of the replica circuit depending upon an output of the comparator so as to match an impedance value of the output driver with the impedance value of the replica circuit, wherein:

the second semiconductor device further includes an adjustment circuit including a memory unit storing table parameters that adjusts the impedance value of the output driver of each of the first semiconductor device and the second semiconductor device, the adjustment circuit of the second semiconductor device outputting an output signal to the control circuit of the first semiconductor device, and wherein:

the control circuit of the first semiconductor device controls the impedance value of the output driver of the first semiconductor device with information outputted from the adjustment circuit of the second semiconductor device without use of the replica circuit of the first semiconductor device.

* * * * *